(12) United States Patent
Ouvrard et al.

(10) Patent No.: US 10,629,595 B2
(45) Date of Patent: Apr. 21, 2020

(54) POWER SEMICONDUCTOR DEVICE HAVING DIFFERENT GATE CROSSINGS, AND METHOD FOR MANUFACTURING THEREOF

(71) Applicant: Infineon Technologies Austria AG, Villach (AT)

(72) Inventors: Cedric Ouvrard, Villach (AT); Cesar Augusto Braz, Villach (AT); Olivier Guillemant, Villach (AT); David Laforet, Villach (AT); Gerhard Noebauer, Villach (AT); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/020,133

(22) Filed: Jun. 27, 2018

(65) Prior Publication Data

US 2019/0006357 A1 Jan. 3, 2019

(30) Foreign Application Priority Data

Jun. 29, 2017 (DE) .................. 10 2017 114 568

(51) Int. Cl.
*H01L 27/088* (2006.01)
*H01L 21/8234* (2006.01)
(Continued)

(52) U.S. Cl.
CPC .... *H01L 27/088* (2013.01); *H01L 21/823418* (2013.01); *H01L 21/823456* (2013.01);
(Continued)

(58) Field of Classification Search
None
See application file for complete search history.

(56) References Cited

U.S. PATENT DOCUMENTS 6,005,271 A * 12/1999 Hshieh ............... H01L 29/0696
257/331
6,503,786 B2 1/2003 Klodzinski
(Continued)

FOREIGN PATENT DOCUMENTS

DE 102014112322 A1 3/2016
DE 102014112379 A1 3/2016
(Continued)

OTHER PUBLICATIONS

Spirito, P., et al., "Thermal Instabilities in High Current Power MOS Devices: Experimental Evidence, Electro-thermal Simulations and Analytical Modeling", Proceedings of the 23rd International Conference on Microelectronics (MIEL 2002), vol. 1, Niš, Yugoslavia, May, 12-15, 2002, pp. 23-30.

*Primary Examiner* — Nishath Yasmeen
(74) *Attorney, Agent, or Firm* — Murphy, Bilak & Homiller, PLLC

(57) ABSTRACT

A power semiconductor device includes a semiconductor substrate having a first side. A plurality of active transistor cells is formed in an active area of the semiconductor substrate. Each of the plurality of active transistor cells includes a spicular trench which extends from the first side into the semiconductor substrate and has a field electrode. A gate electrode structure has a plurality of intersecting gate trenches running between the spicular trenches. The intersecting gate trenches form gate crossing regions of different shape when seen in a plan projection onto the first side of the power semiconductor device.

14 Claims, 15 Drawing Sheets

(51) Int. Cl.
  *H01L 29/423*  (2006.01)
  *H01L 29/739*  (2006.01)
  *H01L 29/78*   (2006.01)
  *H01L 29/06*   (2006.01)
  *H01L 29/08*   (2006.01)
  *H01L 29/40*   (2006.01)

(52) U.S. Cl.
  CPC ...... *H01L 29/0696* (2013.01); *H01L 29/0869* (2013.01); *H01L 29/407* (2013.01); *H01L 29/4238* (2013.01); *H01L 29/7397* (2013.01); *H01L 29/7813* (2013.01)

(56) References Cited

U.S. PATENT DOCUMENTS

| | | |
|---|---|---|
| 8,907,418 B2 | 12/2014 | Noebauer et al. |
| 9,252,263 B1 * | 2/2016 | Vielemeyer ......... H01L 29/7813 |
| 9,722,036 B2 * | 8/2017 | Hirler .................. H01L 29/407 |
| 2012/0061753 A1 * | 3/2012 | Nishiwaki ............. H01L 29/407 |
| | | 257/331 |
| 2013/0113038 A1 * | 5/2013 | Hsieh ................ H01L 29/42376 |
| | | 257/330 |
| 2016/0079376 A1 * | 3/2016 | Hirler .................. H01L 29/407 |
| | | 257/328 |

FOREIGN PATENT DOCUMENTS

| | | |
|---|---|---|
| DE | 102015104988 A1 | 10/2016 |
| DE | 102015117469 A1 | 4/2017 |

\* cited by examiner

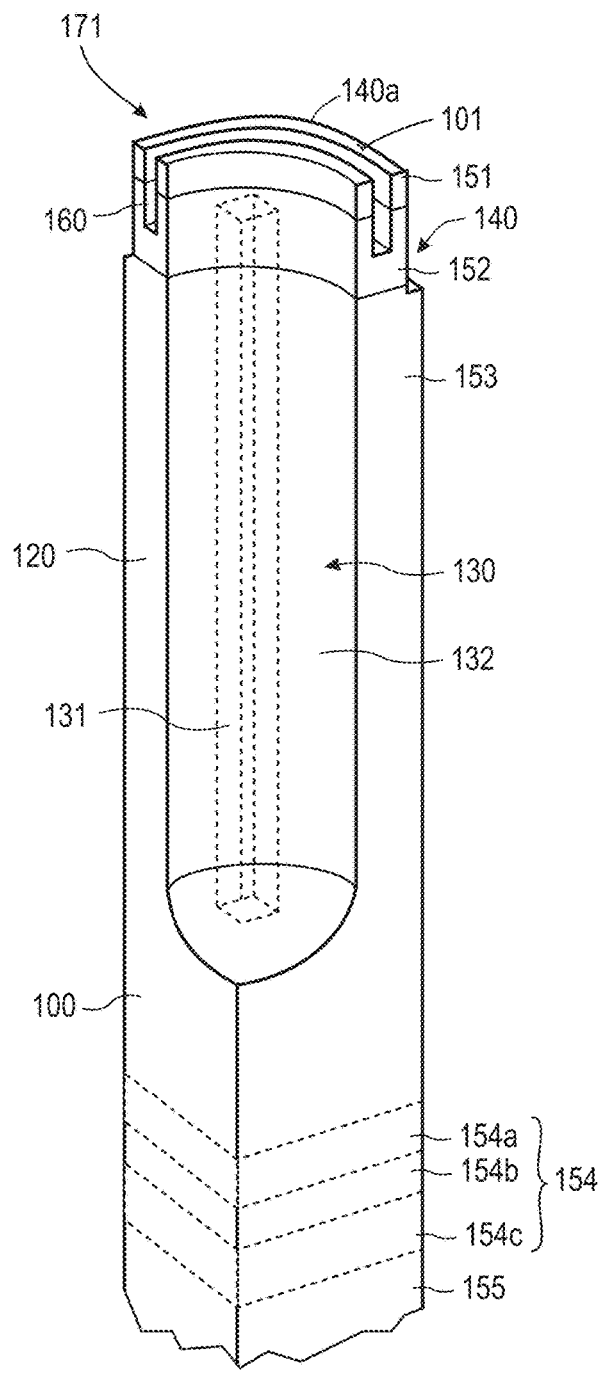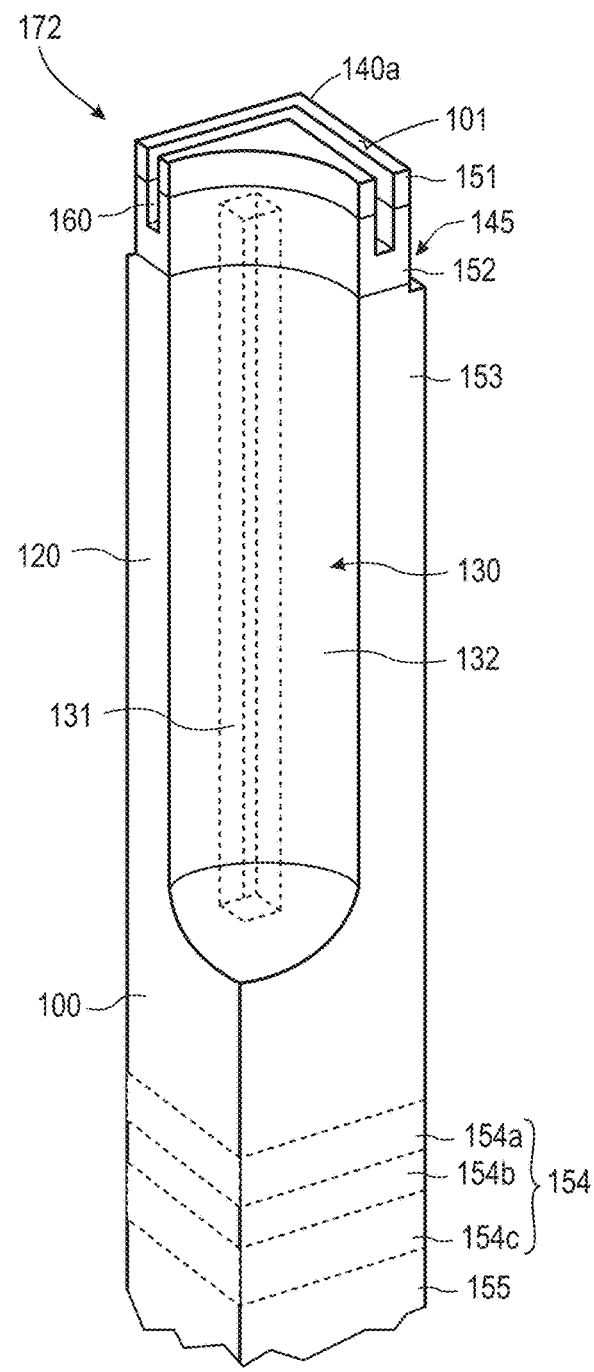

POWER SEMICONDUCTOR DEVICE HAVING DIFFERENT GATE CROSSINGS, AND METHOD FOR MANUFACTURING THEREOF

TECHNICAL FIELD

Embodiments described herein relate to power semiconductor devices having at least two different types of gate crossings. Further embodiments pertain to methods for manufacturing power semiconductor devices.

BACKGROUND

Power semiconductor devices, or simply power devices, are usually optimized for their intended purpose. For example, Power-MOSFETs are optimized to be used as switches in Switched Mode Power Supply (SMPS) topologies. In such circuits, the switches are either in ON- or in OFF-state, and operated at high frequency. The main optimization target is typically to minimize losses in the power device by, for example, minimizing the switching time.

Power device may also be used for other purposes such as protective elements for electronic boards or specific delicate components on the electronic board. Large inrush currents and electrical surges may pose a risk for electronic components and can lead to malfunction or destruction of electronic devices. When used as protective element, power devices with reduced or minimized losses are also of interest. In addition to that, the power device may also be provided as dissipative element during switching events in order to protect the electronic board and/or other components on the board.

For example, if an electronic board were to be added to an operating cabinet which is operative, excessive inrush currents may occur as there are usually large capacitors placed at the connectors provided for connecting the electronic board. The capacitors dynamically short the supply voltage. The charging current is only limited by the resistance of the conductor tracks on the board, which may potentially lead to destruction of components or the board. To avoid this problem, the current needs to be limited. Power-MOSFETs may be used as current limiter when operated in the so-called saturation mode: operation at high drain-source voltage $U_{DS}$ and low to moderate drain currents $U_D$. The power device acts like a voltage-dependent resistor in the saturation mode.

The optimization of Power-MOSFETs toward lowest on-state resistance, which is abbreviated as $R_{ON}$, for reducing losses had led to an increase of the transconductance per chip area. The transconductance $g_m$ per chip area is a basic parameter of a power device which relates the current drawn from the output of the power device to the voltage appearing across the input of the power device.

On the other hand, a large transconductance may lead to a reduced ruggedness of the power device when operating in saturation mode. The following shall illustrate this. Assuming a small area of the power device is slightly hotter than other areas of the power device. This may occur due to uneven dissipation of generated heat. The locally increased temperature can lead to a local variation of device parameters. The area of increased temperature can carry more current leading to higher thermal losses in that area. As a result, the area having a higher temperature will "attract" even more current from colder areas leading to a potential thermal runaway. This tendency can be expressed by the temperature coefficient $\partial I_D/\partial T$ which describes the temperature dependency of the drain current. A positive value of this temperature coefficient $\partial I_D/\partial T$ means that the device operation is potentially instable. For modern common devices, the higher transconductance is roughly proportional to the temperature coefficient $\partial I_D/\partial T$ in the saturation mode.

The positive temperature coefficient limits the so-called safe operating area, abbreviated as SOA, of the device. The SOA is expressed as a region in a logarithmic $I_D$ vs. $U_{DS}$ plot where the device can safely be operated without destruction. Manufactures provide a SOA for each power device to allow the customer to set the operation condition for safely operating the power devices without experiencing malfunction. FIG. 15 shows an example for a typical SOA of a power MOSFET. The safe operating area is limited by a number of lines which are characteristic for the specific Power-MOSFET.

The line 201 is the so-called $R_{DS(on)}$-limit-line which describes the linear dependency between the source-drain voltage $U_{DS}$ and the drain current $I_D$. The slope of line 201 is defined by the specific on-state resistance $R_{ON}$ of the MOSFET at the rated junction temperature and the rated gate voltage specific of the semiconductor device. The horizontal line 202 is the so-called package-limit-line, defined by the maximum current which the external wires or connection of the package, in which the MOSFET is embedded, can carry. For example, bond wires may become too hot for currents exceeding a maximum current. The vertical line 203 is given by the maximum breakdown voltage of the MOSFET. The inclined line 204 is referred to as maximum-power-limit-line and expresses the device's capability to dissipate heat. Line 204 depends, inter alia, on the junction temperature, the duration of the pulse length and on the device package. For example, the maximum rated junction temperature in automotive applications can be in a range of about 150° C. Line 204 represents here an exemplary pulse of 10 ms. The maximum-power-limit-line can be calculated by assuming thermal equilibrium between the generated power $P_{generated}$ and dissipative power $P_{dissipated}$.

A further limitation is imposed by the above-mentioned risk of a thermal runaway. This risk is increased for devices having a high transconductance leading to a "kink" in the maximum power limit line as indicated by line 205 which is also referred to as thermal-instability-limit-line. Although the device may be in principle capable of tolerating pulses at higher drain-source voltages, the increased risk of a thermal runaway dictates to limit the maximum power. When comparing line 204 with line 205 it becomes apparent that there is a significant reduction of the total area of the SOA which may have practical implications for operating the power device. Basically, the semiconductor device is considered to be thermally unstable if the generated power rises faster than the power which can be dissipated:

$$\frac{\partial P_{generated}}{\partial T} > \frac{\partial P_{dissipated}}{\partial T}$$

In this case, the semiconductor device is not in thermal equilibrium and may undergo a thermal runaway.

Attempts have been made to enlarge the SOA. However, there is need for further improvement.

SUMMARY

According to an embodiment, a power semiconductor device includes a semiconductor substrate having a first side. A plurality of active transistor cells are formed in an active area of the semiconductor substrate. Each of the plurality of active transistor cells may include a spicular trench which extends from the first side into the semiconductor substrate and comprises a field electrode. A gate electrode structure has a plurality of intersecting gate trenches running between the spicular trenches, wherein the intersecting gate trenches form gate crossing regions of different shape when seen in plan projection onto the first side of the power semiconductor device.

According to an embodiment, a power semiconductor device includes a semiconductor substrate having a first side. A plurality of spaced apart spicular trenches extends from the first side into the semiconductor substrate, wherein each of the spicular trenches includes a field electrode. A plurality of intersecting gate trenches are arranged between adjacent spicular trenches, wherein, when seen in plan projection onto the first side, the plurality of the intersecting gate trenches form a grid structure with a plurality of grid meshes to surround respective spicular trenches. The gate trenches includes respective gate electrodes which are adjacent to body regions and define channel regions in the body regions, wherein a respective channel region completely surrounds a respective spicular trench when seen in plan projection onto the first side of the semiconductor substrate. The plurality of grid meshes include grid meshes of different shape when seen in plan projection onto the first side.

According to an embodiment, a method for manufacturing a power semiconductor device includes providing a semiconductor substrate having a first side; forming a plurality of active transistor cells in an active area of the semiconductor substrate, wherein each of the plurality of active transistor cells comprises a spicular trench which extends from the first side into the semiconductor substrate and comprises a field electrode; and forming a gate electrode structure comprising a plurality of intersecting gate trenches running between the spicular trenches, wherein the intersecting gate trenches form gate crossing regions of different shape when seen in plan projection onto the first side of the semiconductor substrate.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIGS. 2A and 2B illustrate portions of transistor cells having different gate crossings.

DETAILED DESCRIPTION

In the following detailed description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical", "under", "below", "lower", "over", "upper" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

As used herein, the terms "having", "containing", "including", "comprising" and the like are open ended terms that indicate the presence of stated elements or features, but do not preclude additional elements or features.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

Figure 1:
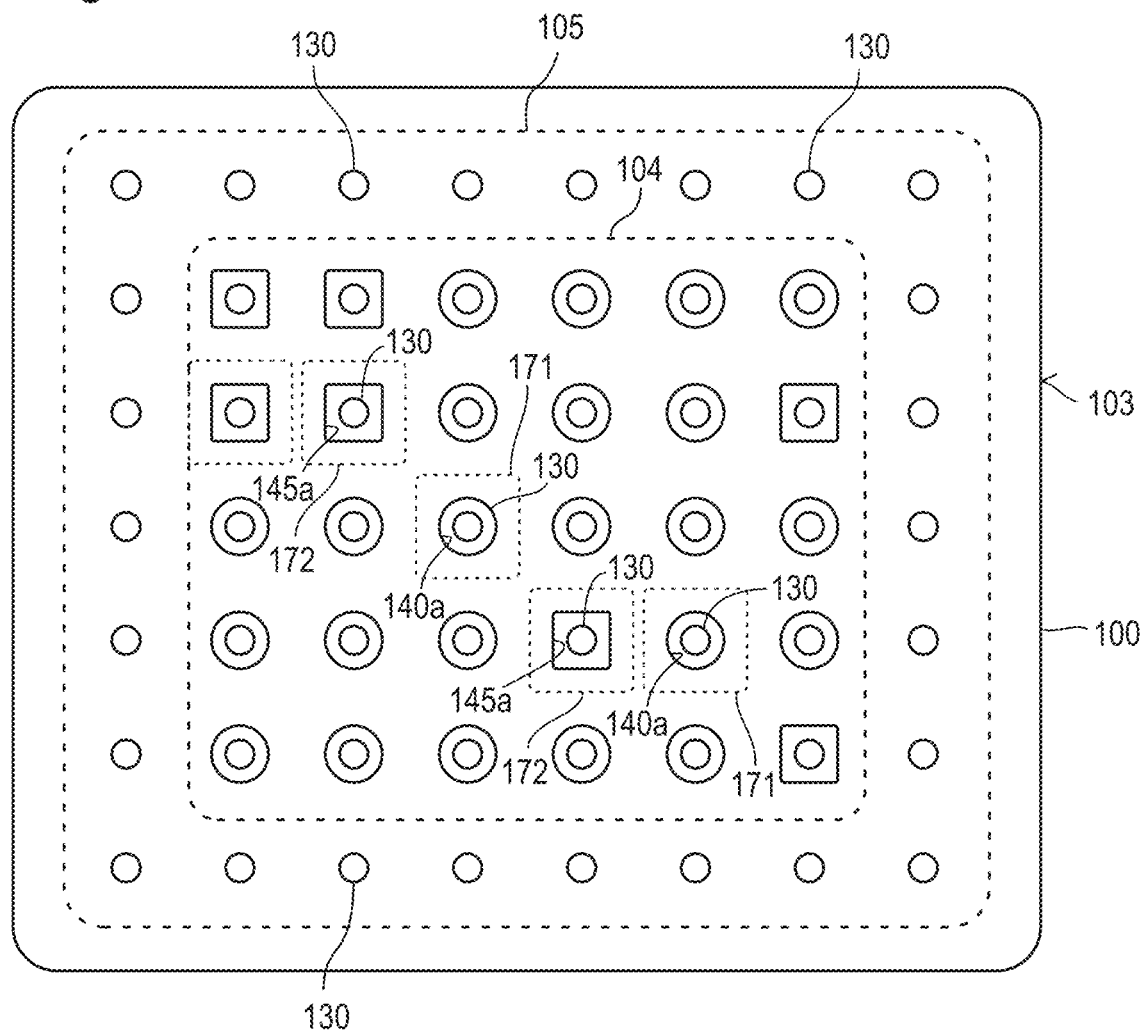
FIG. 1 illustrates a plan view onto a semiconductor device according to an embodiment.
Figure 3:
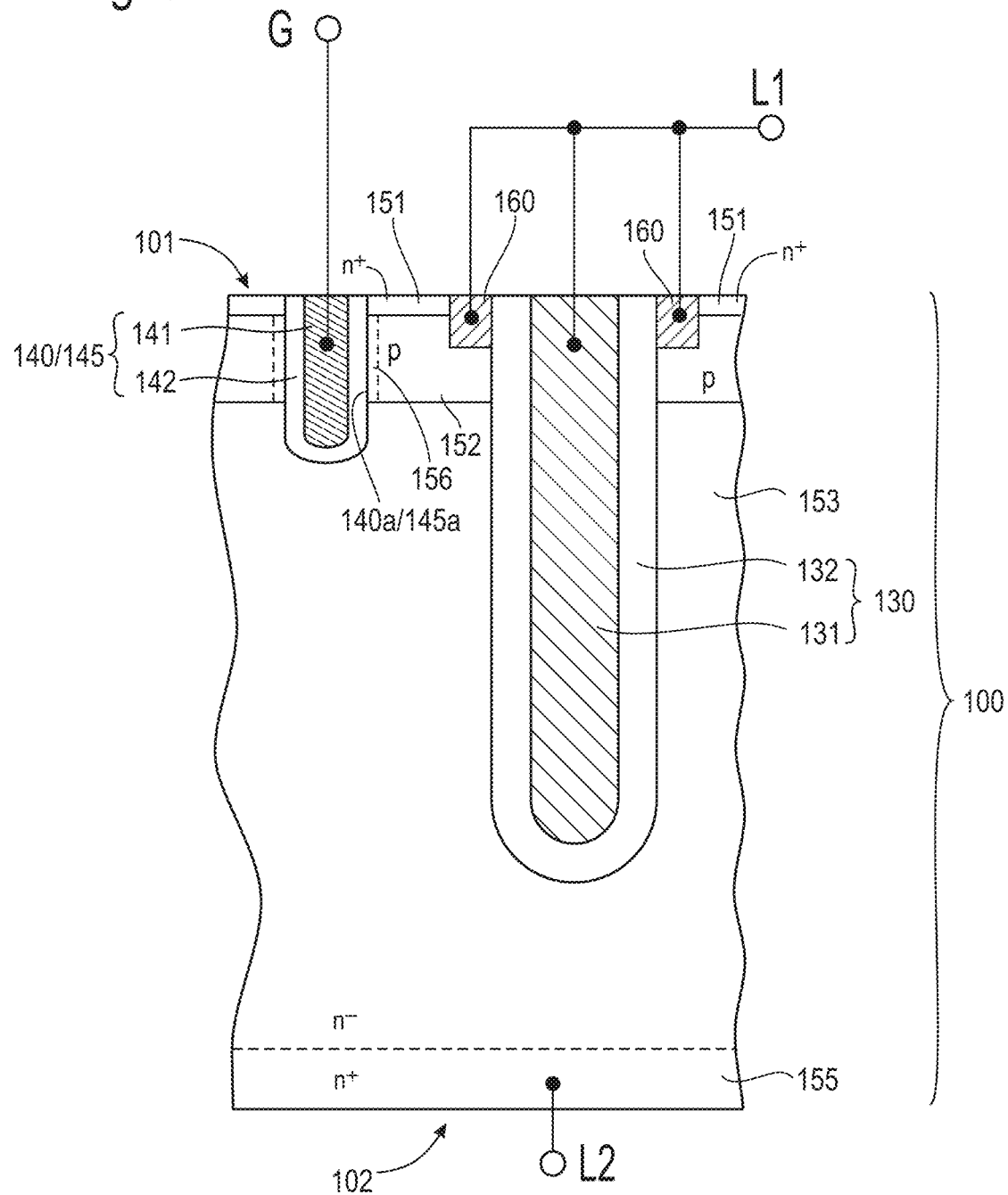
FIG. 3 illustrates in a vertical cross-sectional view a portion of a transistor cell according to an embodiment.

With reference to FIGS. 1, 2A, 2B and 3, an embodiment of a power semiconductor device, which is simply referred to as semiconductor device, is described. FIG. 1 shows a plan view onto a first side 101 of the semiconductor substrate 100 of the semiconductor device. FIGS. 2A and 2B show 3-dimensional views of portions of first and second active transistors cells 171, 172 formed in the semiconductor substrate 100 of the semiconductor device. FIG. 3 illustrates a vertical cross-sectional view of a portion of an active transistor cell 171, 172.

As shown in FIG. 1, the semiconductor substrate 100 has an outer boundary defined by a rim 103 which is a lateral surface of the semiconductor substrate 100. The semiconductor substrate 100 can be made of any semiconductor material suitable for manufacturing semiconductor components. Examples of such materials include, without being limited thereto, elementary semiconductor materials such as silicon (Si), group IV compound semiconductor materials such as silicon carbide (SiC), and binary III-V semiconductor materials such as gallium nitride (GaN). When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductors currently mainly Si, SiC and GaN materials are used. In exemplary embodiments, the semiconductor substrate 100 is Si without being limited thereto.

The semiconductor device includes an active area 104 and an edge termination area 105 each defined and formed in the semiconductor substrate 100. The edge termination area 105 is arranged between the active area 104 and the rim 103. The active area 104 may include a plurality of active transistor cells 171, 172 which can be arranged in a regular pattern. FIG. 1 illustrates an arrangement of the active transistor cells 171, 172 in vertical columns and horizontal lines at constant pitch. Other arrangements such as a hexagonal arrangement are also possible.

The active area 104 may include first active transistor cells 171 and second active transistor cells 172. As explained further below, the first and second active transistor cells 171, 172 may differ from each other in the layout or shape of gate crossings leading to a different behaviour of the respective active transistor cells.

Each of the first and second active transistor cells 171, 172 may include a spicular trench 130 extending from the first side 101 into the semiconductor substrate 100. The spicular trenches 130 may have, in a plan view onto the first side 101 of the semiconductor substrate 100, a circular cross-section or a cross-section similar to a circle. Each of the spicular trenches 130 includes a field electrode 131 which is perhaps best shown in FIGS. 2A, 2B and 3.

Spicular trenches 130 may also be formed in the edge termination area 105 to improve the blocking capabilities of the semiconductor device as best illustrated in FIG. 1.

According to an embodiment, the first and second active transistor cells 171, 172 differ from each other in the layout or shape of gate trenches 140, 145 which surround, in a plan view onto the first side 101, the spicular trenches 130. The boundaries of the respective gate trenches 140, 145 are illustrated in FIG. 1 at 140a and 145a. The boundaries 140a, 145a define and limit the shape of the gate trenches 140, 145 when seen in plan projection onto the first side 101.

Each of the gate trenches 140, 145 includes a gate electrode 141 which is electrically insulated from the surrounding semiconductor substrate 100 by a gate dielectric 142. According to an embodiment, the gate dielectric 142 has substantially the same thickness in the first and second active cells 171, 172 and does not vary locally. The gate dielectric 142 may be formed by thermal oxidation of exposed portions of the respective gate trenches 140 and 145 of the first and second active transistor cells 171, 172.

The first and second active transistor cells 171, 172 can be more or less equally distributed over the whole area of the active area 104. It is also possible to arrange the first and second active transistor cells 171, 172 in clusters which are distributed over the active area 104. For example, a cluster of second active transistor cells 172 is illustrated in the upper left part of the active area 104. The lower right part of the active area 104 illustrates a more mixed arrangement of the first and second active transistor cells 171, 172.

Figure 4:
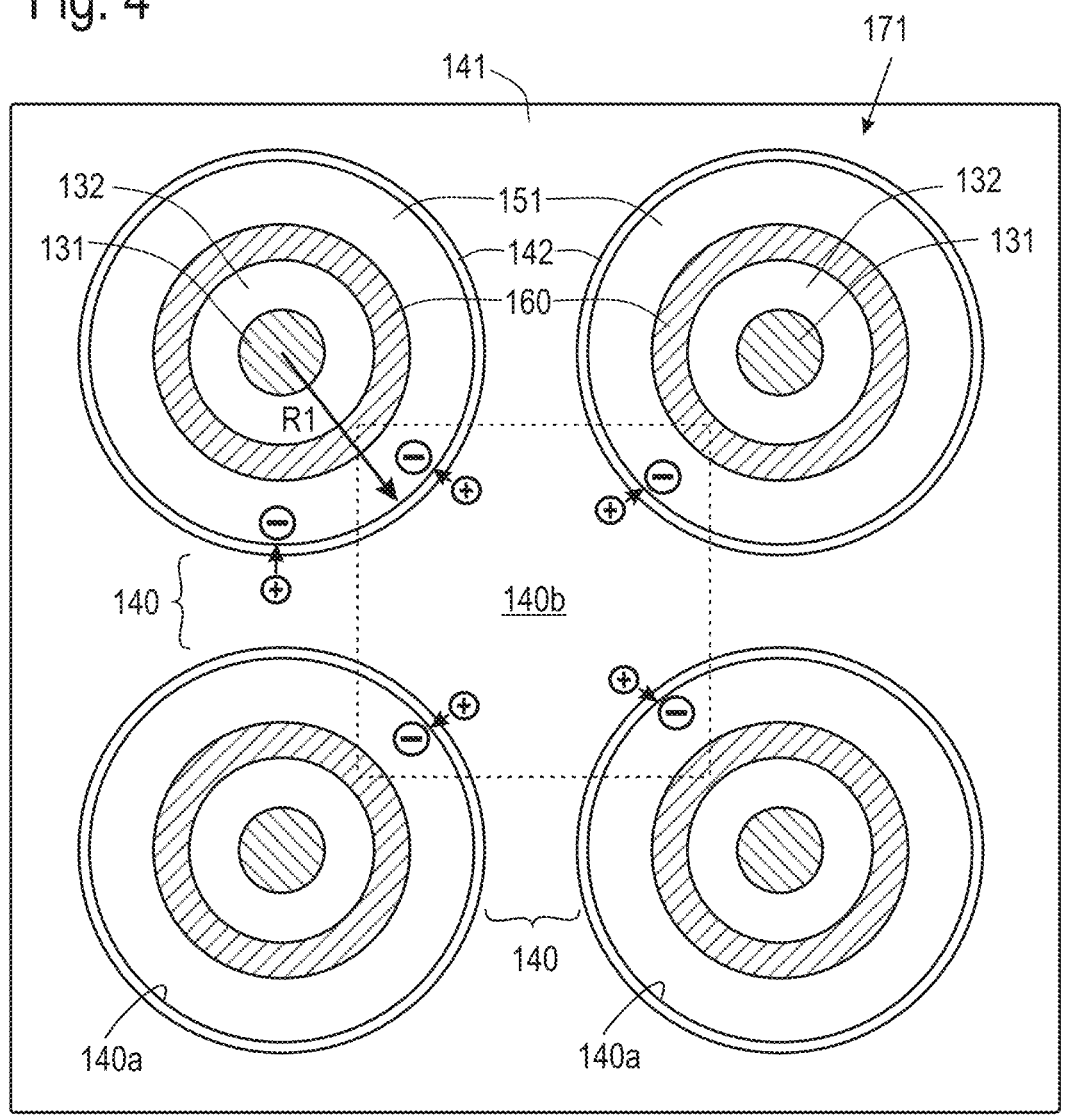
FIG. 4 illustrates in a plan view transistor cells having a round gate crossing.
Figure 5:
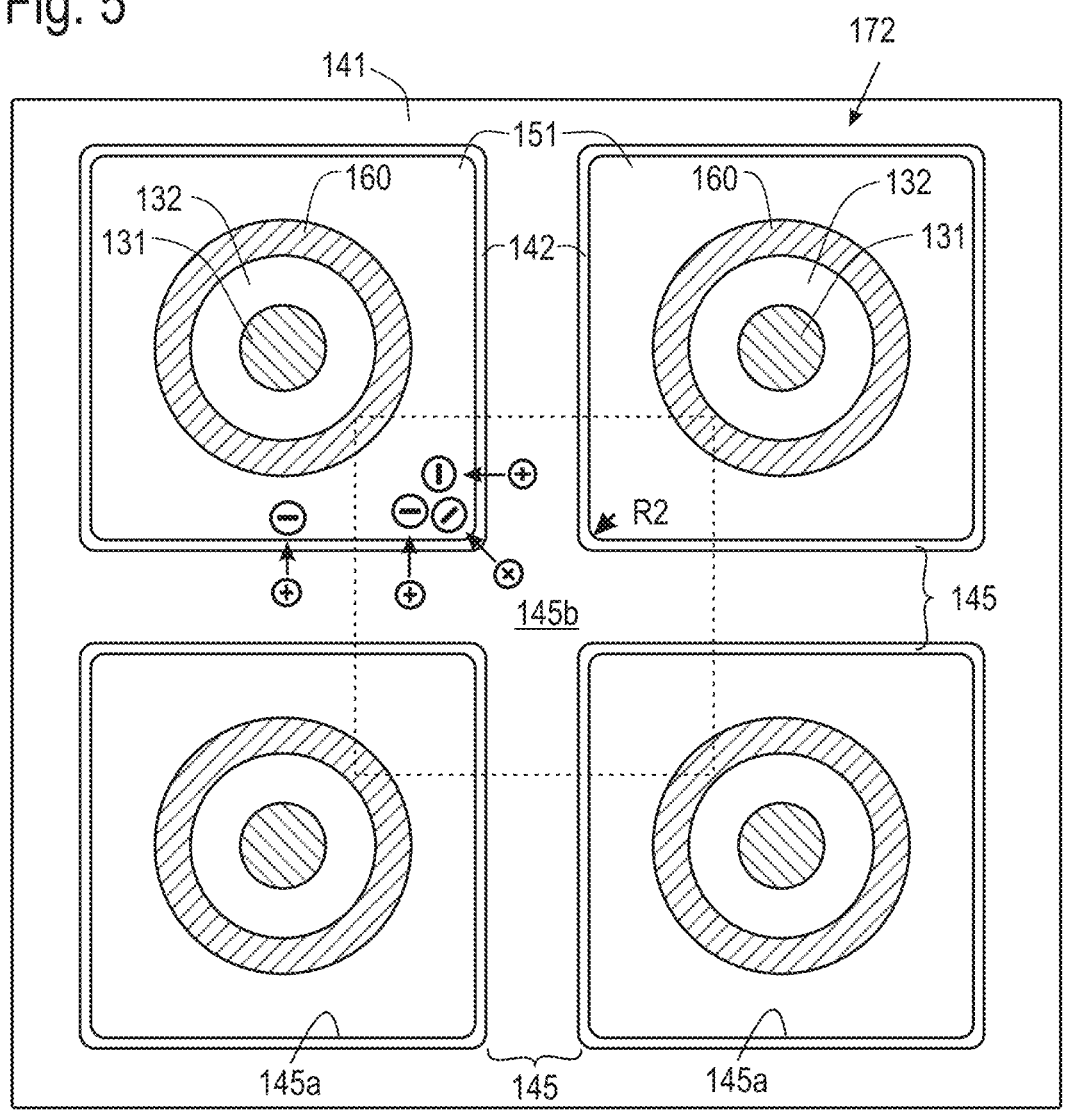
FIG. 5 illustrates in a plan view transistor cells having a 90° gate crossing.

The semiconductor device further includes a gate electrode structure formed by the plurality of intersecting gate trenches 140, 145 running between the spicular trenches 130. The intersecting gate trenches 140, 145 form gate crossing regions 140b, 145b of different shape when seen in plan projection onto the first side 101 of the semiconductor substrate 100. The different gate crossing regions 140b, 145b are formed in the same semiconductor substrate 100. Examples of gate crossing regions are illustrated in FIGS. 4 and 5.

The spicular trenches 130 of the first active transistor cells 171 and of the second active transistor cells 172 extend into the semiconductor substrate 100 to a given depth as perhaps best shown in FIGS. 2A and 2B. Each spicular trench 130 includes a field electrode 131 which is electrically insulated from the surrounding semiconductor substrate 100 by a thick field oxide 132. The location and shape of the field electrodes 131 are illustrated in phantom lines in FIGS. 2A and 2B. The cross-sectional shape of the field electrodes 131 can be, for example, circular or square like. FIG. 3 illustrates that the field electrode 131 may have a rounded end pointing toward a second side 102 of the semiconductor substrate 100.

As perhaps best shown in FIG. 3, the spicular trenches 130 extends much deeper into the semiconductor substrate 100 than the gate trenches 140. Furthermore, the field oxide 132 is significantly thicker than the gate dielectric 142.

Each of the first and second active transistor cells 171 and 172 includes a highly doped source region 151 of a first conductivity type forming a pn-junction with a body region 152 of a second conductivity type. The body region 152 forms a further pn-junction with a low-doped drift region 153 of the first conductivity type. According to an embodiment, the first conductivity type is n-type while the second conductivity type is p-type. It is, however, also possible that the first conductivity type is p-type while the second conductivity type is n-type.

Below the drift region 153 there is arranged an optional field stop region 154 of the first conductivity type and a highly doped drain region 155 of the first conductivity type. The doping concentration of the drain region 155 is significantly higher than the doping concentration of the drift region 153. The doping concentration of the optional field stop region 154 is between the doping concentration of the drift region 153 and the doping concentration of the drain region 155 and is illustrated by sub-regions 154a, 154b, 154c of increasing doping concentration toward the drain region 155.

According to an embodiment, the semiconductor device is a Power-MOSFET with a plurality of gate trenches, wherein selected gate trenches run in a non-parallel manner to each other and intersect in given regions forming gate crossing regions of different shape or layout. The shape is defined by the boundary of the gate trenches when seen in plan projection on the first side 101. Typically, but only optionally, the semiconductor device includes spicular trenches with field electrodes. Other embodiments do not include spicular trenches, for example for low voltage power devices where field electrodes are not needed.

The semiconductor device may also be an IGBT when region 155 is of the second conductivity type. In this case, region 155 is often referred to as emitter region.

Each of the first and second active transistor cells 171, 172 includes a contact structure 160 which provides an ohmic connection of the source region 151 and the body region 152, respectively, to a source metallisation. The contact structure 160 can be formed as a separate contact trench, as for example illustrated in FIGS. 2A and 2B, or as a contact groove as illustrated in FIG. 3. In each case, the contact structure 160 is arranged between the respective gate trench 140, 145 and the spicular trench 130. When the contact structure 160 is formed as a contact groove as illustrated in FIG. 3, a portion of the groove may be in contact with the field oxide 132 of the spicular trench 130 or may even partially extend into the field oxide 132.

Each of FIGS. 2A and 2B illustrates only a portion of the respective active transistor cells 171, 172. In each case, the respective gate trench 140, 145 surrounds at least partially, typically completely, the respective spicular trench 130 when seen in plan projection onto the first side 101. The boundary 140a, 145a of the gate trenches 140, 145 is defined by the side surface of the respective gate trench 140, 145. The respective boundary 140a, 145a of the gate trenches 140, 145 is the boundary that faces the spicular trench 130. Since the gate trenches 140, 145 can be arranged between adjacent spicular trenches 130, both sides of the respective gate trenches 140, 145 may form respective boundaries.

A channel region 156 is defined in the body region 152 along the respective boundaries 140a, 145a of the gate trenches 140, 145. The conductivity of the channel region 156 is controlled by the voltage applied to the gate electrode 141.

The gate electrodes 141 are electrically connected to the gate metallisation G. The source regions 151, the body regions 152 and the field electrodes 131 are commonly electrically connected to the source metallisation L1. Both the gate metallisation G and the source metallisation L1 are provided at the first side 101 of the semiconductor substrate 100. Different thereto, a drain metallisation L2 is provided at the second side 102 of the semiconductor substrate 100 to electrical connect the drain region 155.

The differences between the first active transistor cells 171 and the second active transistor cells 172 is further described in connection with FIGS. 2A, 2B, 4 and 5. FIGS. 4 and 5 respectively illustrate portions of four active transistor cells 171, 172 in a plan view onto the first side 101. The spicular trench 130 formed by the field electrode 131 and the field oxide 132 of each first active transistor cell 171 has a circular outer cross-sectional shape. The second active transistor cells 172 illustrated in FIG. 5 include spicular trenches 130 having basically the same cross-sectional shape as the spicular trenches 130 of the first active transistor cells 171. In addition to that, each of the first active transistor cells 171 and the second active transistor cells 172 includes the contact structure 160 having a ring-like shape and surrounding the respective spicular trenches 130.

The gate trenches 140, 145 are formed by vertically and horizontally running trenches relative to the orientation of FIGS. 4 and 5. From a perspective of the semiconductor substrate 100, the gate trenches 140, 145 run along the first side 101 in different lateral direction to form intersecting trenches. The gate crossing regions, or gate crossings, 140b and 145b of the first and second active transistor cells 171, 172 are different from each other. The first active transistor cells 171 illustrated in FIG. 4 may include a gate crossing region 140b which defines a substantially round transition between intersecting gate trenches 140. The transition may be defined by a first radius $R_1$ of the boundary 140a of the gate trenches 140.

When comparing FIG. 4 with FIG. 5, it becomes apparent that the gate crossing regions 145b of the second active transistor cells 172 have, relative to the gate crossing regions 140b of the first active transistor cells 171, a more sharp transition between the intersecting gate trenches 145. The transition of the gate crossing regions 145b of the second active transistor cells 172 may be defined by a second radius $R_2$ of the boundary 145a of the gate trenches 145.

Due to the different shape of the boundaries 140a, 145a of the gate trenches 140, 145 facing the spicular trenches 130, the shape of the respective source regions 151 of the first and second active transistor cells 171, 172 also differs from each other, when seen in plan projection onto the first side 101. The inner boundary of the respective source regions 151 is defined by an outer boundary of the contact structure 160 which has an outer circular cross-sectional shape. The outer boundary of the respective source regions 151 is defined by the inner boundaries 140a, 145a of the respective gate trenches 140, 145. Therefore, the cross-sectional shape of the source regions 151 of the first active transistor cells 171 and of the second active transistor cells 172 also differ from each other.

The intersecting gate electrode trenches 140, 145 form a grid structure with grid meshes of different shape. A single grid mesh is defined by a closed and connected inner boundary 140a, 145a of the intersecting gate trenches 140, 145.

The different geometrical shape of the gate trenches 140, 145 and particularly of the gate crossing regions 140b, 145b results in a different behaviour of the first and second active transistor cells 171, 172. On the assumption of a positive gate voltage, the accumulation of negative charges, i.e. electrons, in the body regions 152 is increased at the gate crossing regions 145b relative to other regions at the comparably sharp transition between the intersecting gate trenches 145 of the second active transistor cells 172. This is illustrated in FIG. 5 by the accumulated negative charges. Note that the accumulation of negative charges in the body region arranged below the source region is of interest here. The accumulated negative charges form the channel region 156 along the gate dielectric 142. Due to the higher accumulation of negative charges at the sharp gate crossing regions 145b, the channel regions 156 at the gate crossing regions 145b are rendered conductive before the channel regions in other regions are formed.

The increased accumulation of negative charges at the gate crossing regions 145b is mainly a geometrical effect of the comparably sharp transition between the intersecting gate trenches 145. The negative charges are accumulated due to the electrostatic effect brought about by the intersecting gate trenches that boarder two sides of the body region 152. This geometrical effect leads to a locally varying threshold voltage $U_{th}$ of the second active transistor cells 172 with a "virtually" reduced threshold voltage at the gate crossing regions 145b relative to the threshold voltage $U_{th}$ in regions outside the gate crossing regions 145b. For example, the absolute value of the threshold voltage $U_{th}$ in regions where the gate trenches 145 are substantially straight is higher than the absolute value of the threshold voltage $U_{th}$ at the gate crossing regions 145b. The geometrical effect results in an "early-on" of the semiconductor device in selected areas. Early-on means that conductive channels are formed in selected areas, i.e. at the comparably sharp gate crossing regions 145b, before conductive channels are formed in other regions.

The reduced threshold voltage at the gate crossing regions 145b can be about 60% to 80% of the threshold voltage outside the gate crossing regions 145b. The geometrical effect can also be described as a local increase of the electric field strength leading to an increased accumulation of charges.

Different thereto, the first transistor cells 171 having a round transition between intersecting gate trenches 140 do not show a locally varying threshold voltage $U_{th}$ as the first radius R1 is comparably large so that no sharp transition is formed which could lead to a locally increased electrical field strength. The geometrical influence of the smoothly curved round transition on the threshold voltage $U_{th}$ can be neglected.

The semiconductor device therefore has a controlled early-on effect in selected regions of the semiconductor substrate 100. This early-on effect mitigates the risk of a thermal runaway of the semiconductor device and increases the available SOA.

For ease of description, the gate crossing regions of the first active transistor cells 171 can be referred to as first gate crossing regions 140b, the gate crossing regions of the second active transistor cells 172 can be referred to as second gate crossing regions 145b. According to an embodiment, when seen in plan projection onto the first side 101, each of first gate crossing regions 140b defines a round transition between intersecting gate trenches 140 with a first radius R1 and each of the second gate crossing regions 145b defines a sharp transition between intersecting gate trenches 145 with a second radius R2, wherein the first radius R1 is larger than the second radius R2.

In practical embodiment, the second gate crossing regions 145b do not have a completely sharp transitions but a small round transition due to, for example, the thermal oxidation of the gate dielectric 142 leading to a partial rounding. Although a very sharp transition is practically difficult to achieve, the second gate crossing regions 145b as illustrated in FIG. 5 can be referred to as 90° crossings. The first gate crossing regions 140b are substantially circular and intentionally not sharp, and can be referred to as round transition.

According to an embodiment, the first radius $R_1$ is at least twice as large as the second radius $R_2$. According to a further embodiment, the radius $R_1$ is at least three times as large as the second radius $R_2$.

The influence of the early-on effect on the thermal robustness of the semiconductor device is described in connection with FIGS. 6 and 7 and with simulation results illustrated in FIGS. 8a, 8B, 9A, 9B, 10, 11 and 12, without wishing to be tied to theory.

Figure 6:
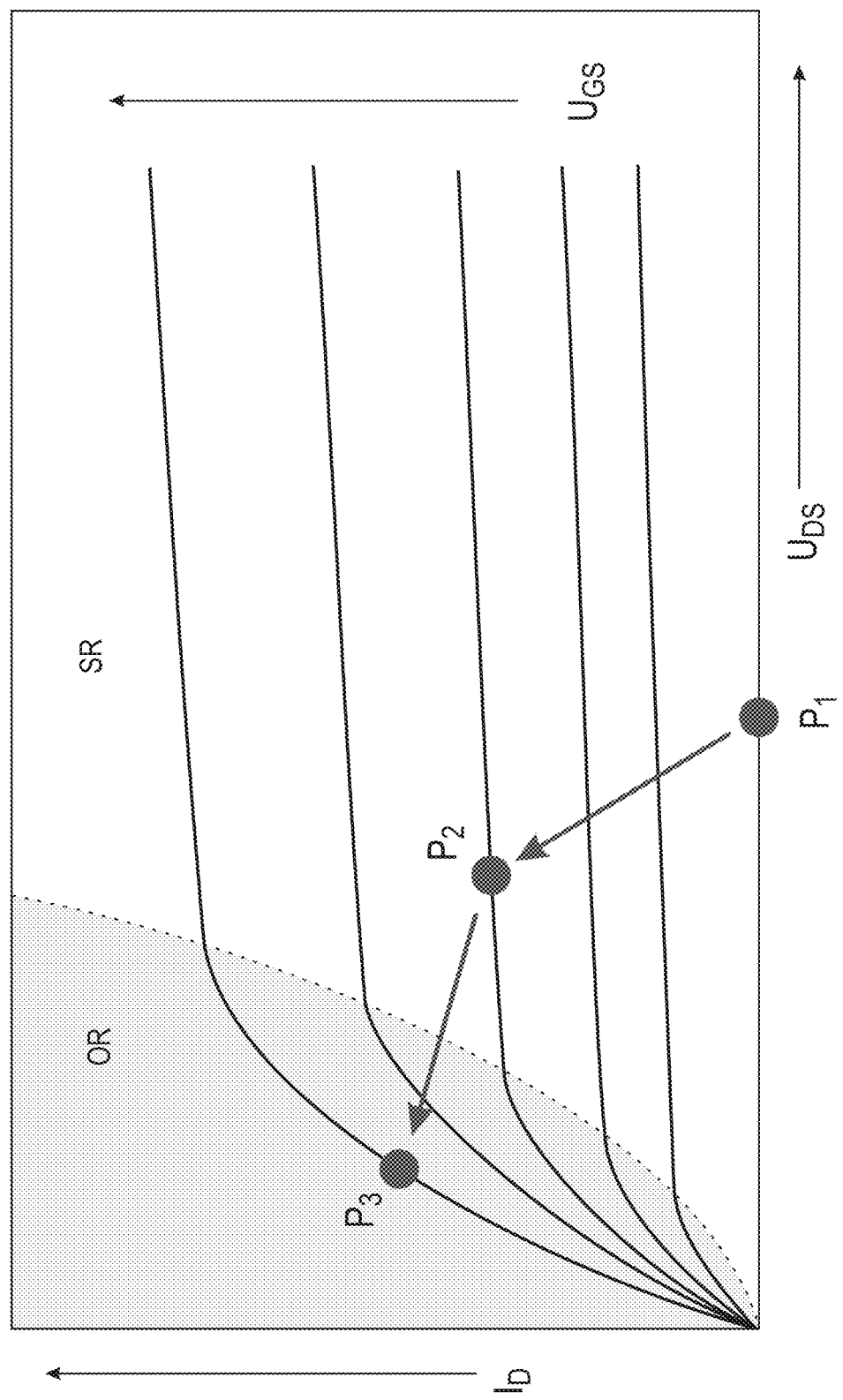
FIG. 6 schematically illustrates an $I_D$ vs. $U_{DS}$ plot for a MOSFET for illustrating the ohmic region and the saturation region of a MOSFET.

FIG. 6 schematically illustrates the output characteristics of a semiconductor device such as a Power-MOSFET as a relation of $I_D$ vs. $U_{DS}$ for different $U_{GS}$. For a given gate voltage $U_{GS}$ the drain current $I_D$ substantially linearly increases with increasing drain-source voltage $U_{DS}$ in the so-called ohmic region OR, which is also refer to as linear region. With increasing the drain-source voltage while keeping the gate voltage constant, the drain current $I_D$ further increases until it reaches a constant value. The conductivity of the channel is saturated and a further increase of the drain-source voltage $U_{DS}$ does not further increase the drain current. This is a result of the pinching-off of the channel with increasing drain-source voltage $U_{DS}$. The region where the drain current $I_D$ substantially remains constant is referred to as saturation region indicated at SR in FIG. 6.

When no gate voltage is applied, the semiconductor device is rendered non-conductive and the semiconductor device is operated at point $P_1$ indicated in FIG. 6. At this point, a high drain-source voltage $U_{DS}$ appears at the device's terminals but no current flows through the device. When, on the other hand, the semiconductor device is in a fully conductive state, the semiconductor device is operated in the ohmic region, for example at $P_3$ indicated in FIG. 6. At point $P_3$, the drain current $I_D$ is comparably large but the drain-source voltage $U_{DS}$ is comparably low so that only a comparably low electrical power is consumed by the semiconductor device. During switching between conductive and non-conductive state the semiconductor device needs to transit the saturation region SR and may carry moderate to high drain currents $I_D$ at moderate to high drain-source voltages $U_{DS}$. During the transition, the power dissipation can be very high and an effective dissipation of heat is needed to avoid that the semiconductor device is destroyed.

As described in connection with the SOA exemplarily illustrated in FIG. 15, a short transition time, which corresponds to a short pulse duration, is better tolerable by the semiconductor device than a comparably long transition time. On the other hand, many applications exist where the semiconductor device is intentionally operated in the saturation region SR, for example when using as current source. Another applications where the semiconductor device is operated in the saturation region are e-fuse applications or load-switches. The semiconductor device may be operated at point $P_2$ in the saturation region SR as illustrated in FIG. 6. For safely operating the semiconductor device in the saturation region SR two constrains should be observed. First, the total power generated or consumed by the semiconductor device should not be larger than the power which can be distributed by the device and the packaging in which the semiconductor device is embedded. Secondly, the rise of the generated power should not be faster than the device's and the package's capability to increase heat dissipation. The latter relates to the thermal inertia brought about by the semiconductor device and its packaging.

The critical parameter is the dependency of the drain current $I_D$ from the temperature T, specifically from the junction temperature $T_{junction}$. As explained above in connection with FIG. 15, the device is thermally instable if the generated power $P_{generated}$ rises faster than the device can dissipate the generated heat. Therefore, the semiconductor device should be operated so that the following relation (1) is obeyed:

$$\frac{\partial P_{generated}}{\partial T} < \frac{\partial P_{dissipated}}{\partial T} \tag{1}$$

with $P_{dissipated}$ denoting the dissipated power.

The generated power can be defined as $P_{generated} = U_{DS} \cdot I_D$. Based on a thermal dissipation model explained in P. Spirito et al., "*Thermal instabilities in the High Current Power MOS Devices: experimental evidence, electro-thermal simulations and analytical modelling*", 23rd International conference on microelectronics MIEL 2002, Vol. 1, Niš, Yugoslavia, May 2002, the content of which is hereby incorporated by reference, it is possible to derive a stability criteria for safely operating the semiconductor device, expressed by relation (2):

$$U_{DS} \cdot \frac{\partial I_D}{\partial T} \cdot Z_{th} < 1 \tag{2}$$

with $Z_{th}$ being the thermal impedance of the semiconductor device. Since $U_{DS}$ and $Z_{th}$ are positive values, thermal instability may only occur if $\partial I_D/\partial T$ is positive. Relation (2) defines a stability criteria for operating the semiconductor device.

Figure 7:
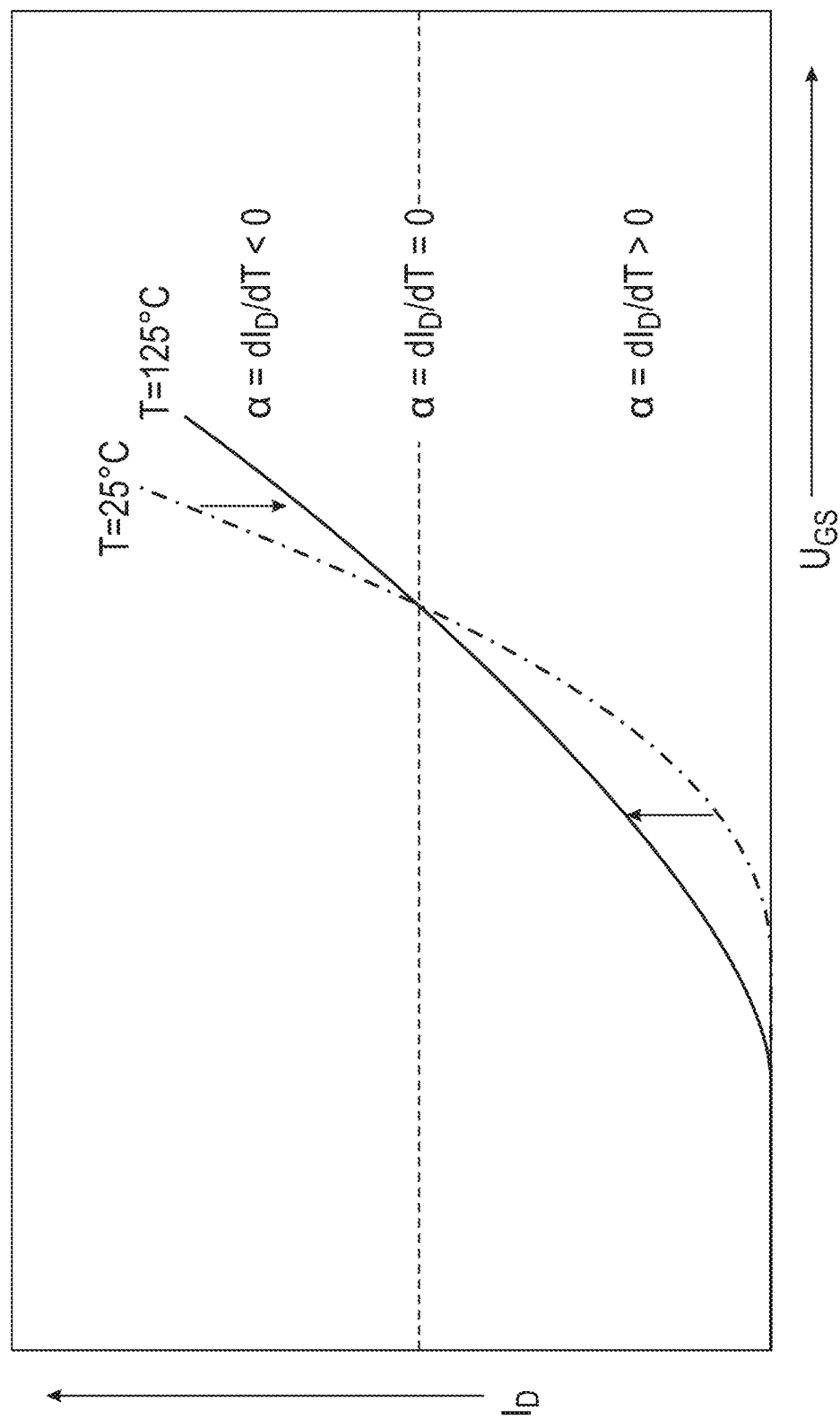
FIG. 7 schematically illustrates an $I_D$ vs. $U_{DS}$ plot for a MOSFET for illustrating the temperature dependency.

Typically, $\partial I_D/\partial T$ is positive at low $I_D$ as indicated in FIG. 7 which illustrates $I_D$ vs. $U_{GS}$, i.e. the variation of the transconductance of the semiconductor device at different junction temperatures. At higher $I_D$ the temperature coefficient $\partial I_D/\partial T$ is negative. The change from positive to negative values of the temperature coefficient corresponds to the crossover point of the transconductance curves for different junction temperatures as exemplified in FIG. 7 for a junction temperature of 25° C. and a junction temperature of 125° C. The crossover point is often referred to as zero temperature coefficient (ZTC) point. As mentioned above, thermal instability can only occur if the semiconductor device is operated at a gate voltage $U_{GS}$ below the $U_{GS}$ of the ZTC point. Operating the semiconductor device at a low gate voltage occurs during switching and when deliberately operating the semiconductor device in the saturation region SR. The ZTC point is related to the transconductance. An increased transconductance leads to a shift of the ZTC point towards higher $U_{GS}$.

The change of the temperature coefficient is a result of two effects which counterbalances each other. On one hand, the resistance of a semiconductor device increases over temperature due to a reduction of the charge carriers mobility with increasing temperature. On the other hand, the threshold voltage of a semiconductor device is temperature-dependent and decreases with increasing temperature due to increased excitation of electrons. A decreasing threshold voltage results in a reduction of the channel resistance at given gate voltage and therefore leads to an increase of the drain current. When the temperature is low, the influence of the decreasing threshold dominates while at high temperature the decrease of the charge carrier mobility dominates.

When the semiconductor device is operated at high gate voltages $U_{GS}$ where the temperature coefficient is negative, regions of the semiconductor device having a locally high temperature will draw less current and these hotspots will cool down. On the other hand, when the semiconductor device is operated below the ZTC point where the temperature coefficient is positive, the hot spots will draw even more current as they heat up.

For improving the thermal stability of the semiconductor device, the transconductance of the semiconductor device is locally varied according to embodiments described herein by providing gate crossing regions of different shape. The gate crossing regions, particularly the gate crossing regions 145b having comparably sharp transitions between intersecting gate trenches 145, provide selected regions of the second active transistor cells 172 of the semiconductor device with a reduced threshold voltage leading to the above-described early-on effect. The reduction of the threshold voltage results from the different geometrical shape of the different gate crossing regions. At sharp transitions, the electrical field is locally increased leading to a higher charge accumulation. Since the same gate voltage is applied throughout the semiconductor device, regions where the intersecting gate trenches form sharp transitions are rendered conductive before other regions are conductive. The regions of "earlier conductance" will also have a lower ZTC point than other regions. Therefore, the semiconductor device can be described to have regions of lower ZTC points and regions of higher ZTC points.

Since the effective threshold voltage is reduced at sharp transitions between intersecting gate trenches the influence of the temperature on the threshold voltage is also reduced in these regions. For illustration purposes only, we consider the area at sharp transitions between intersecting gate trenches as "virtual" transistor cells having a reduced threshold voltage relative to other regions forming "normal" transistor cells. An increase of the junction temperature may also effect the already reduced threshold voltage of the virtual transistor cells. However, since the threshold voltage cannot be reduced to any low value, the reduction of the threshold voltage of the virtual transistor cells at increased temperature is limited. As a consequence, the temperature dependency of the device's resistance also dominates at lower temperatures. This means that the virtual transistor cells reach earlier a ZTC point than the normal transistor cells.

The positive behaviour of the sharp transitions on the thermal stability of the semiconductor device has been confirmed by simulations. The simulations of the transfer characteristic (transconductance) have been made for various gate crossing regions with different shape, particularly for round gate crossing regions as illustrated in FIG. 4 and sharp gate crossing regions as illustrated in FIG. 5. In case of round gate crossing regions, the conductive channels turn on homogeneously across the semiconductor device since there is no early-on effect due to the absence of any sharp transition. Different thereto, a semiconductor device having sharp transitions at gate crossing regions (90° gate crossings) shows an early turning-on of conductive channels at the sharp gate crossing regions at a lower gate voltage $U_{GS}$ whereas the conductive channels in remaining regions of the semiconductor device turn later on at a higher gate voltage $U_{GS}$.

To verify the benefit for applications in the situation region SR, the transfer characteristics have been simulated at standard temperature (25° C. corresponding to about 300 K) and at high temperature (125° C. corresponding to about 400 K). As described further above, it is beneficial for applications in the saturation region SR if the transfer characteristics cross at a low current density level. When operating a semiconductor device above the crossing point where $\partial I_D/\partial T=0$, the semiconductor device is intrinsically stable as no thermal runaway would occur.

Figure 8A:
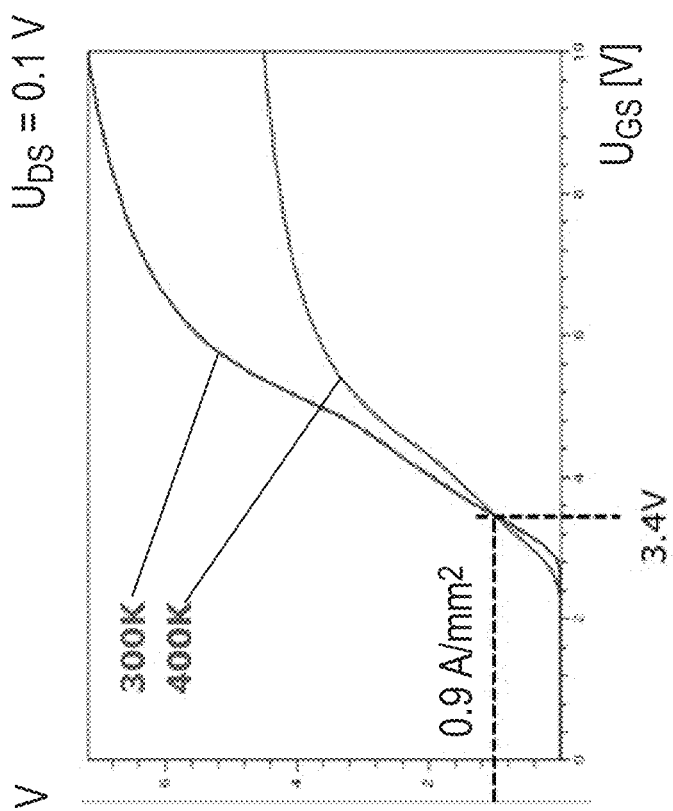
FIGS. 8A and 8B illustrate the temperature-dependent variation of the transconductance expressed by $I_{DS}$ vs. $U_{GS}$ for the round gate crossing and for the 90° gate crossing at low $U_{DS}$ according to embodiments.
Figure 8B:
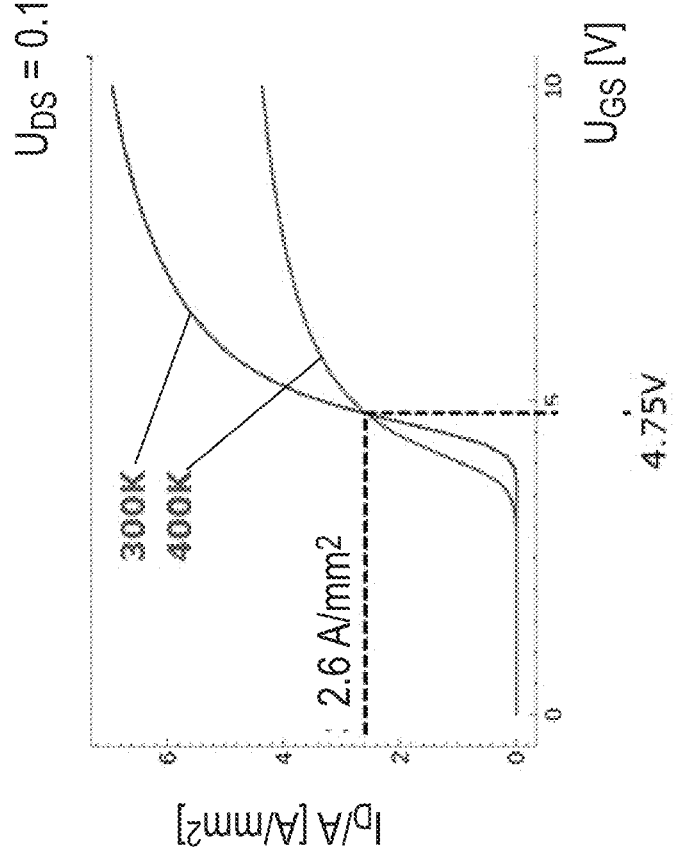
Figure 9B:
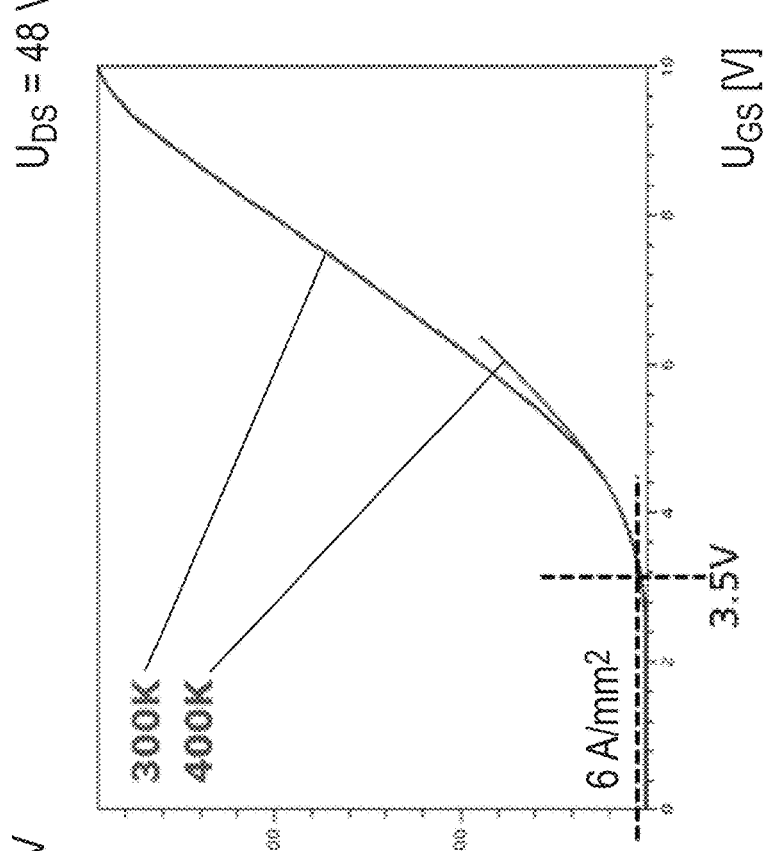
FIGS. 9A and 9B illustrate the temperature-dependent variation of the transconductance expressed by $I_{DS}$ vs. $U_{GS}$ for the round gate crossing and for the 90° gate crossing at high $U_{DS}$ according to embodiments.
Figure 9A:
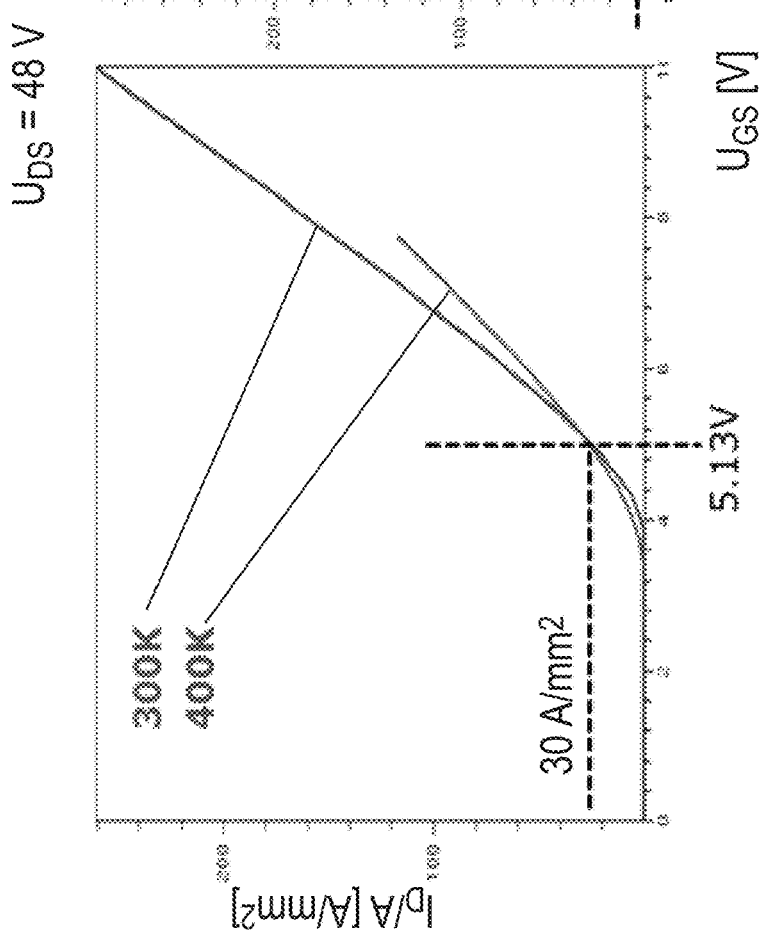

FIGS. 8A, 8B, 9A and 9B illustrate the $I_D$ vs. $U_{GS}$ behaviour, i.e. the transconductance per chip area, at different junction temperatures (300 K vs. 400 K) for round transitions and for sharp transitions. FIGS. 8A and 9A illustrates the $I_D$ vs. $U_{GS}$ behaviour for round transitions as exemplified in FIG. 4, while FIGS. 8B and 9B illustrates the $I_D$ vs. $U_{GS}$ behaviour for sharp transitions as exemplified in FIG. 5. The simulations are based on semiconductor devices each having a plurality of identical transistor cells. In FIGS. 8A and 8B the drain-source voltage $U_{DS}$ has been set to 0.1 V while in FIGS. 9A and 9B the drain-source voltage $U_{DS}$ has been set to 48 V.

When comparing FIG. 8A with FIG. 8B, it becomes apparent that the thermal stable region, defined by $\partial I_D/\partial T<0$, is reached at current densities higher than 2.6 A/mm² for gate crossing regions with round transitions and is reached at current densities higher than 0.9 A/mm² for gate crossing regions with sharp transitions. This means that the ZTC point for the sharp transitions illustrated in FIG. 5 is reduced to 3.4 V relative to the ZTC point appearing at 4.75 V for the round transitions illustrated in FIG. 4. At high $U_{DS}$=48 V, the thermal stable region is reached at current densities higher than 30 A/mm² for gate crossing regions with round transitions and at current densities higher than 6 A/mm² for gate crossing regions having sharp transitions. While the specific values differ, the shift of the ZTC point towards lower gate voltages occurs at low drain-source voltages as well as at high drain-source voltages.

Figure 10:
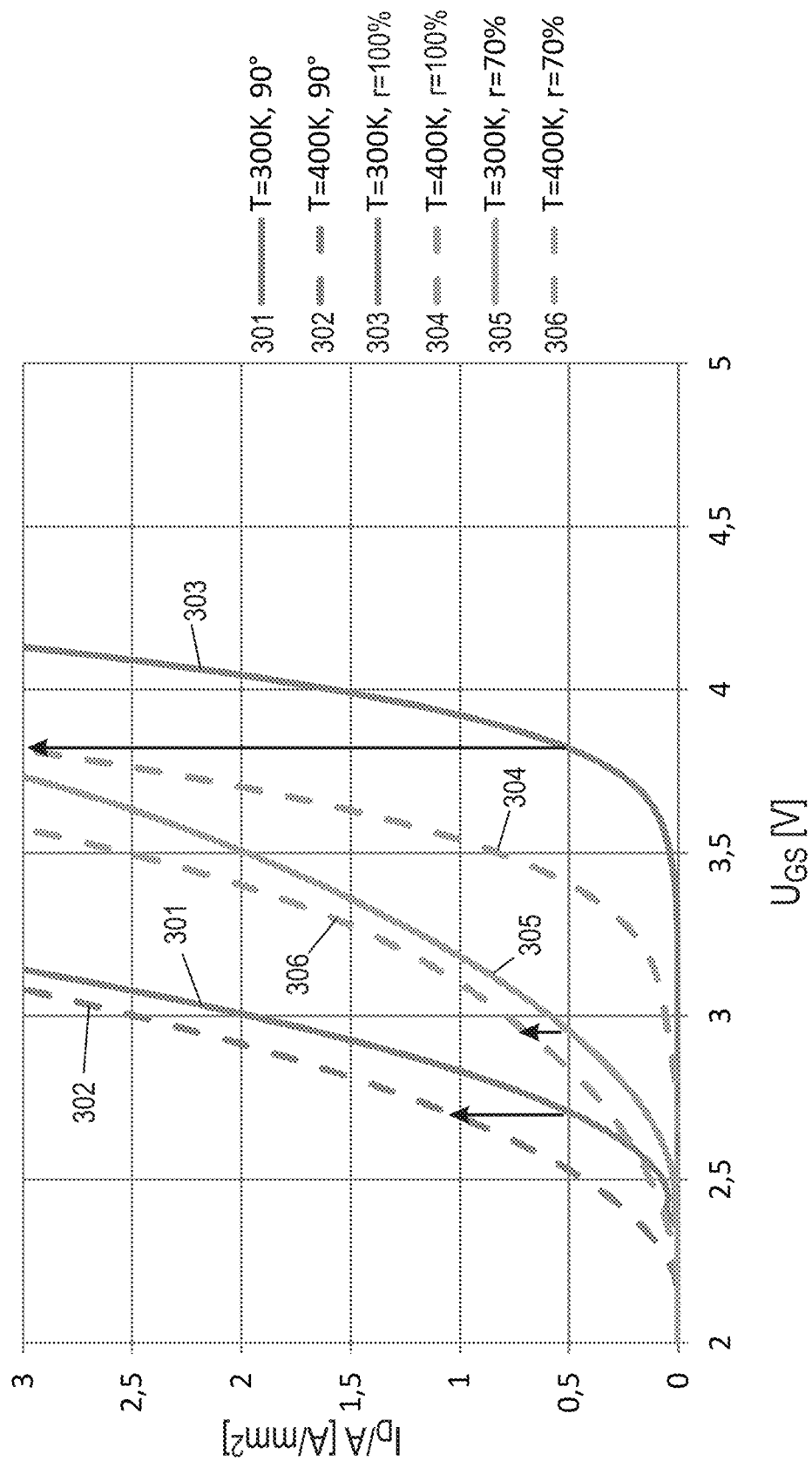
FIG. 10 illustrates results of a simulation of the temperature-dependent variation of the transconductance expressed by $I_{DS}$ vs. $U_{GS}$ for a power device having only round gate crossing regions, for a power device having only 90° gate crossing regions, and for a power device having a mixture of round gate crossing regions and 90° gate crossing regions at high $U_{DS}$ according to embodiments.

The influence of the temperature on the $I_D$ vs. $U_{GS}$ behaviour is further illustrated in FIG. 10 showing results of further simulations. Curves 303 and 304 show the simulation results for a semiconductor device having only round transitions at gate crossing regions such as illustrated in FIG. 4. The value r=100% means that only round transitions (100%) are formed. The drain-source voltage $U_{DS}$ was set to 48 V.

For a temperature increase of about 100 K there is a strong shift of the $I_D$ vs. $U_{GS}$ curve towards higher drain currents per chip area as exemplified by the long vertical arrow indicating the shift from curve 303 to curve 304.

Different thereto, the $I_D$ vs. $U_{GS}$ behaviour of a semiconductor device having only sharp transitions at gate crossing regions is illustrated by curves 301 and 302, respectively. For a device having only sharp transitions the corresponding r-value would be r=0% since no round transitions are provided. Curves 301 and 302 shows that the sharp transitions lead to a significant reduction of the threshold voltage so that the semiconductor device is rendered conductive at lower gate voltages in comparison to a semiconductor device having only round transitions. In addition to that, the influence of the temperature on the $I_D$ vs. $U_{GS}$ behaviour is less pronounced indicated by the rather short vertical arrow between curves 301 and 302.

An even further improvement is observable when a semiconductor device is formed which includes both sharp transitions and round transitions. This is exemplarily indicated by curves 305 and 306 wherein about 70% of the transitions are round transitions and about 30% of the transitions are sharp transitions. This is expressed by the value r=70%. Curves 305 and 306 are located very close to each other which means that an increase of the temperature by about 100 K does not significantly change the $I_D$ vs. $U_{GS}$ behaviour of the semiconductor device. This is indicated by the very short arrow between curves 305 and 306. In addition to that, mixing gate crossing regions with different layout also avoids a high drop of the threshold voltage as is the case for curves 301 and 302. For many applications, the threshold voltage should be within a predefined range.

Figure 11:
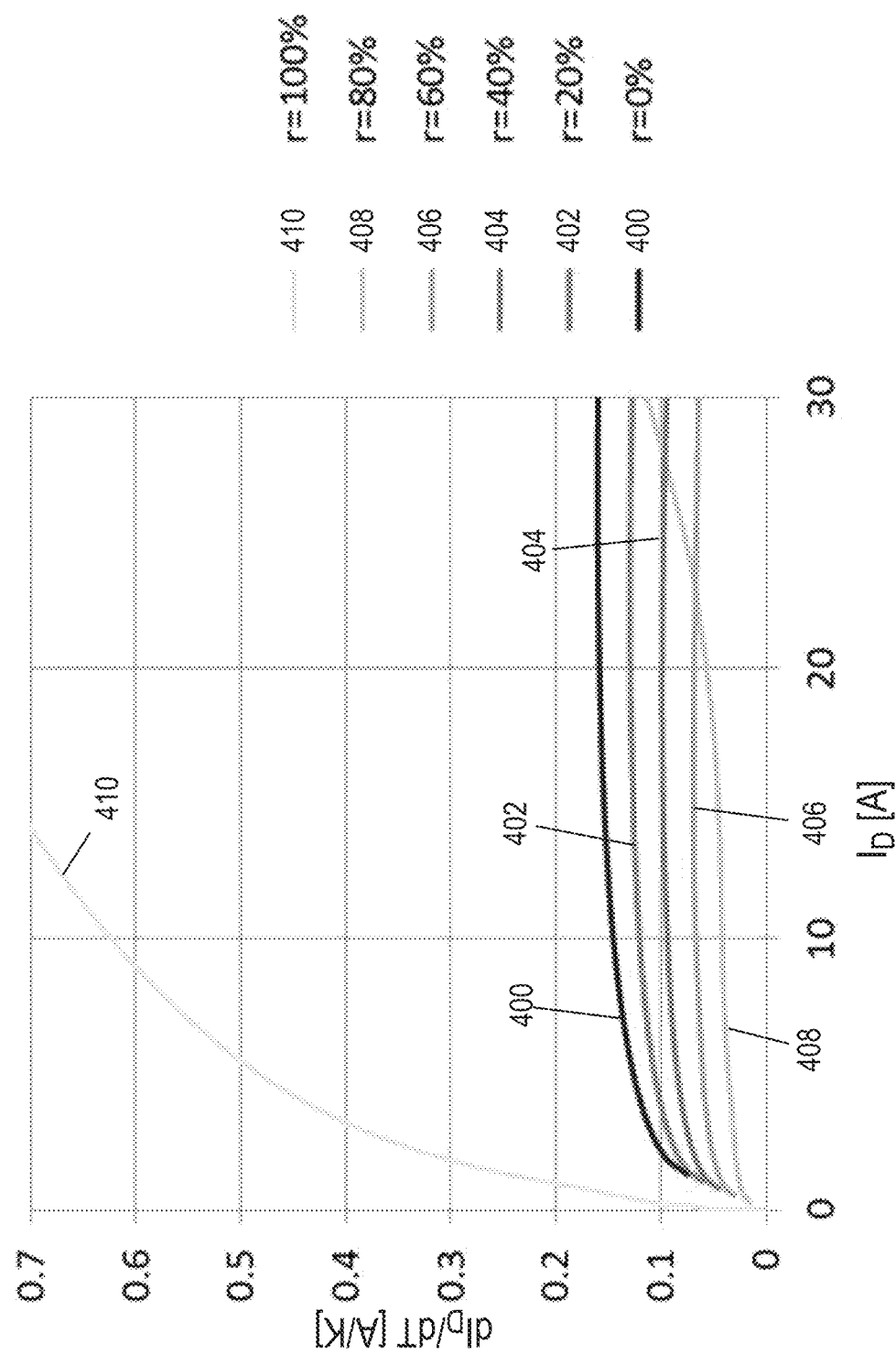
FIG. 11 illustrates the variation of the temperature coefficient $\partial I_D/\partial T$ vs. $I_D$ for a power device having different types of gate crossing regions.

For further illustration, reference is made to FIG. 11 showing the simulation results for semiconductor devices with different mixing ratios between round transitions and sharp transitions of the gate crossing regions. The mixing ratio is expressed by the r-value with r=100% meaning 100% round transitions and no sharp transitions and r=0% meaning 0% round transitions and 100% sharp transitions. FIG. 11 shows the dependency of the temperature coefficient $\partial I_D/\partial T$ relative to the drain current $I_D$ for a semiconductor device having a chip size area of about 30 mm² and a rated blocking voltage of about 100 V.

As illustrated in FIG. 11, a strong reduction of the temperature coefficient over the drain current can be observed for low (0 to 20 A) to moderate (20 to 50 A) drain currents when mixing round and sharp transitions. Although a semiconductor device having only sharp transitions (r=0%) already shows a small thermal coefficient dependency as exemplified by curve 400, a further reduction is surprisingly obtainable when mixing gate crossing regions having different transitions. Even better results can be obtained when setting the mixing value r between 20% and 90%, particularly between 50% and 90%, and more particularly between 60% and 80%. The r-value for each of the curves 400, 402, 404, 406, 408, and 410 is indicated in FIG. 11. Note that the values given for the drain current $I_D$ are only exemplarily for the specific simulation and may be different for other devices.

According to various embodiments, the total number of the first gate crossing regions 140b between intersecting gate trenches 140 can be between 50% and 90% of the total number of the first gate crossing regions 140b and the second gate crossing regions 145b in the active area 104. More particularly, the total number of the first gate crossing regions 140b can be between 60% and 80% of the total number of the first gate crossing regions 140p and the second gate crossing regions 145b. If more than two types of different gate crossing regions are formed in the semiconductor device, the total number refers to the total number of all gate crossing regions.

The mixing of gate crossing regions having different shape, or in other words active transistor cells with different gate crossing regions, further allows tailoring the mean threshold voltage of the semiconductor device. The mean threshold voltage depends on the mixing ratio r as derivable from FIG. 10. A significant reduction of the threshold voltage is observed for semiconductor devices which contain only sharp transitions (curves 301 and 302).

In addition to that, by simply adapting the layout and shape of the gate crossing regions it is possible to significantly improve the thermal stability of the semiconductor device so that the semiconductor device can be safely operated. This expands the available operational area defined in the SOA.

Adapting the layout and shape of the gate crossing regions is a simple and cost-efficient way since it would only be needed to adapt the lithographic mask used for defining the shape of the intersecting gate trenches. No extra mask or etching step is needed. Hence, the solution proposed herein does not add extra costs unlike previous attempts to improve the thermal stability of a semiconductor device.

In addition to that, the gate dielectric can be provided with a constant thickness throughout the semiconductor devices. Other approaches may provide regions with varying thickness of the gate dielectric to vary the transconductance. However, providing regions with different thickness of the gate dielectric often implies additional process steps which increases the costs. Furthermore, the thickness of the gate dielectric may be difficult to precisely set. The geometric variation of the shape of the gate crossing regions is much easier to control.

Figure 15:
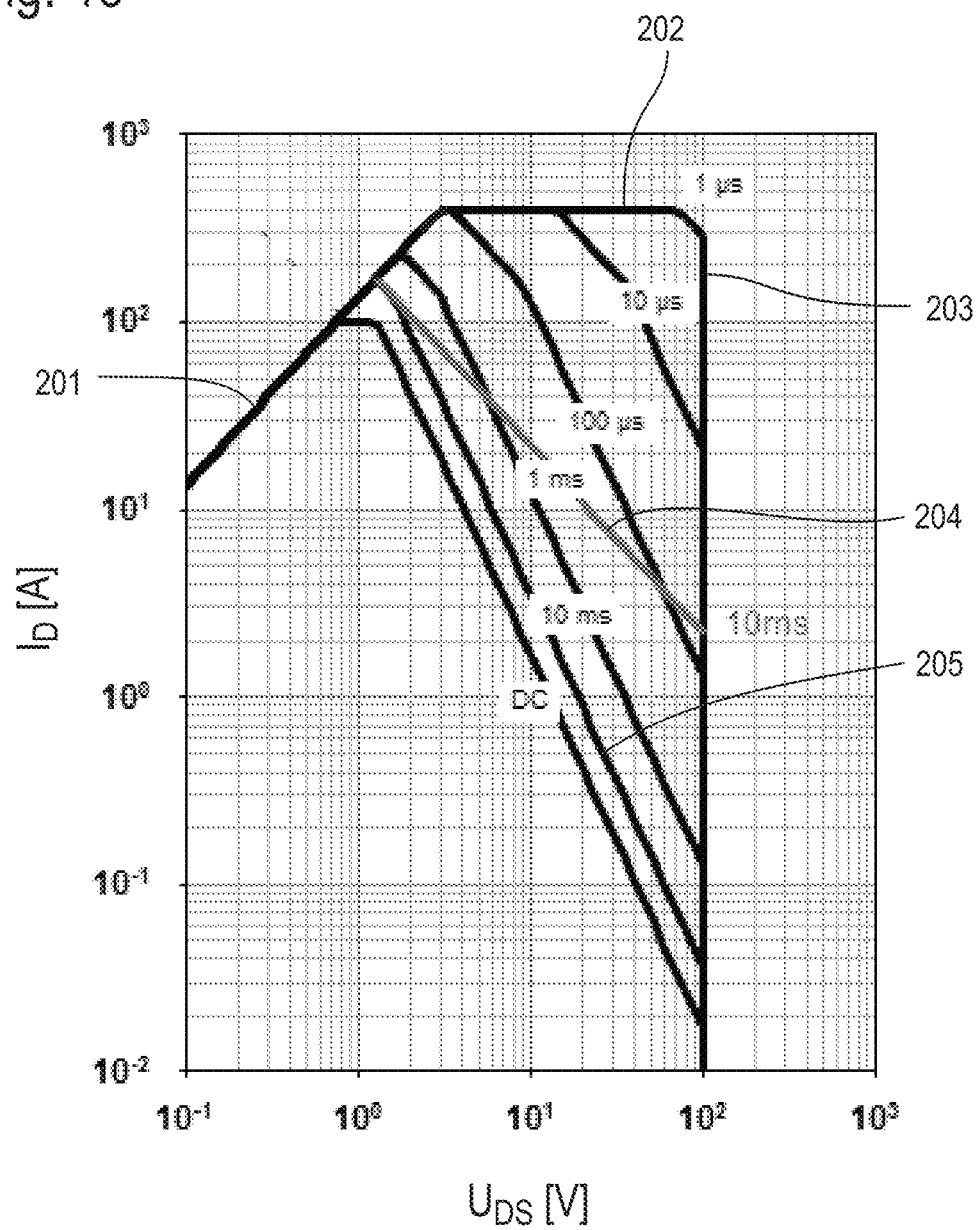
FIG. 15 illustrates a SOA of an exemplary power device.

When determining the SOA for a specific semiconductor device the stability criterion expressed by relation (2) is used to determine the thermal-instability-limit-line 205 as exemplarily illustrated by line 504 in FIG. 15. For practical considerations, the stability criterion of relation (2) has been adapted with an additional security margin and is therefore expressed by relation (3):

$$U_{DS} \cdot \frac{\partial I_D}{\partial T} \cdot Z_{th} < 0.5. \tag{3}$$

Figure 12:
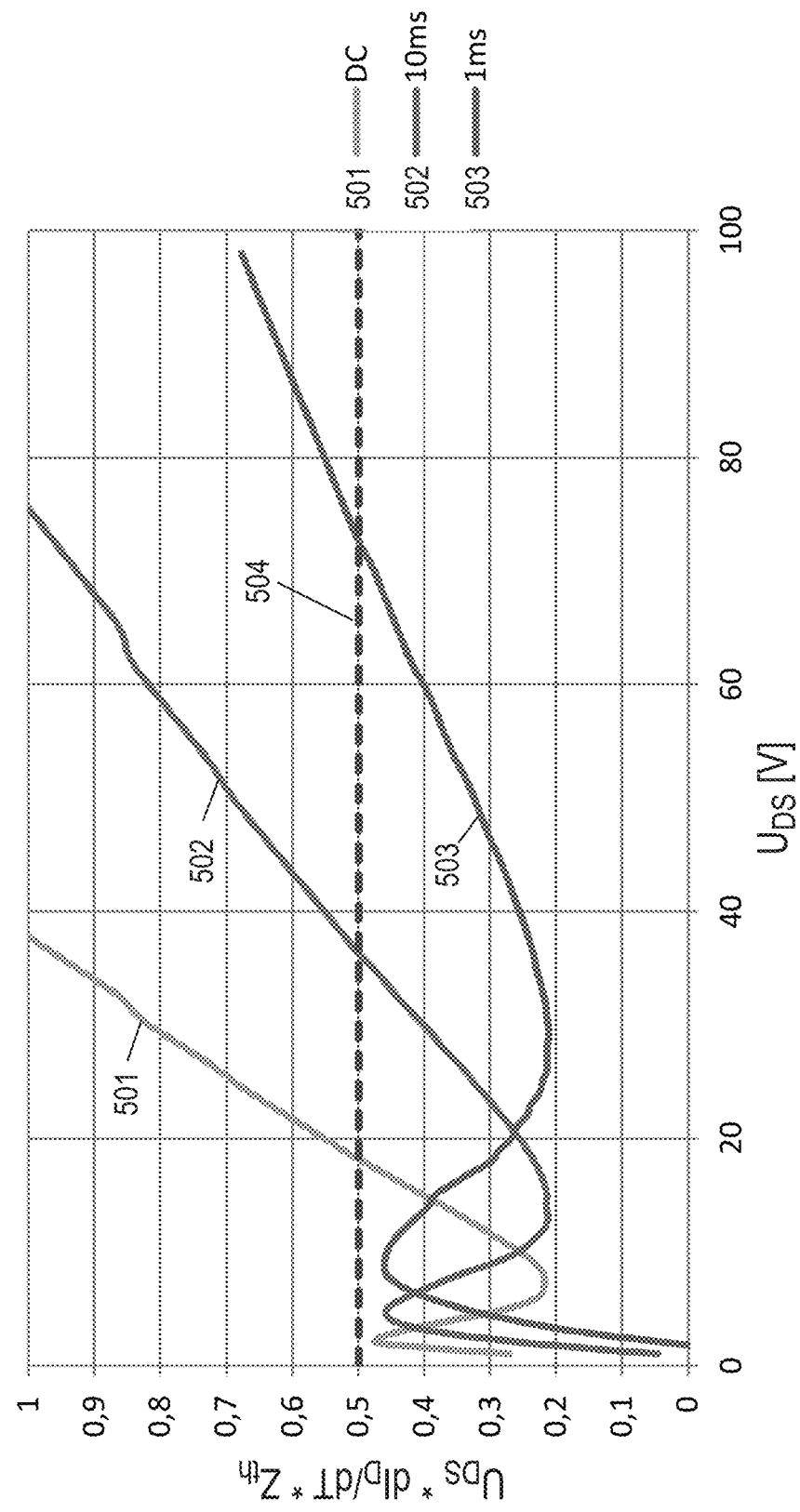
FIG. 12 illustrates the variation of a stability criterion vs. $U_{DS}$ under different switching conditions.

Based on relation (3) exemplary $U_{DS}$ values where the thermal-instability-limit-line 205 would deviate from the maximum-power-limit-line 204 were derived. FIG. 12 illustrates the simulation results for a given example of a semiconductor device having 60% gate crossing regions with round transitions. Since the maximum-power-limit-line 204 depends on the duration of the pulse, different pulse length were considered such as DC pulses illustrated by curve 501, 10 ms pulses illustrated by curve 502, and 1 ms pulses illustrated by curve 503. As it is derivable from FIG. 12, the thermal-instability-limit-line 205 is derated by the thermal-instability-limit-line 204 at $U_{DS}$=18 V for DC operations, at about 36 V for 10 ms pulses and at voltages higher than about 50 V for 1 ms pulses.

Therefore, when appropriately mixing gate crossing regions with different transitions between intersecting gate trenches the influence of the temperature on the $I_D$ vs. $U_{GS}$ behaviour can be significantly reduced and therefore the thermal stability improved. As a consequence the available SOA can be enlarged.

As derivable from the simulations, providing a semiconductor device with intersecting gate trenches having gate crossing regions with different transitions is a cost-effective way to reduce the risk of a thermal runaway. The main effects provided by mixing gate crossing regions having different shapes are (a) the shift of the appearance of the positive temperature feedback, expressed by a positive temperature coefficient $\partial I_D/\partial T$, towards significantly lower current density values as shown in FIGS. 8A, 8B, 9A, 9B and 10, and (b) the reduction of absolute values of the positive temperature coefficient as shown in FIG. 11.

In view of the above, a Power-MOSFET is provided having gate trenches which intersect at given regions to form gate crossing regions. Groups of gate trenches may run perpendicular to each other and form perpendicular gate crossing regions with given transitions between respectively intersecting gate trenches. At gate crossing regions having a sharp or nearly angled transition, the Power-MOSFET turns on earlier due to the electrostatic effect brought about by the specific shape of the sharp transitions. Round transitions do not show this effect.

It is therefore possible, by appropriately selecting the shape of the gate crossing regions, to locally vary the threshold voltage and thus the transconductance per chip area. Gate crossing regions of different shape can be uniformly distributed over the whole active area 104, or can be distributed in clusters. This creates areas in the chip having different threshold voltages and different ZTC.

As a consequence, it is possible to provide a semiconductor device, such as the Power-MOSFET, with a high density of transistor cells which shows an improved ruggedness in the saturation region. The semiconductor device, such as the Power-MOSFET, can also be provided with a low on-state resistance $R_{ON}$ by providing the active transistor cells with a spicular trenches each having a field electrode.

Figure 13:
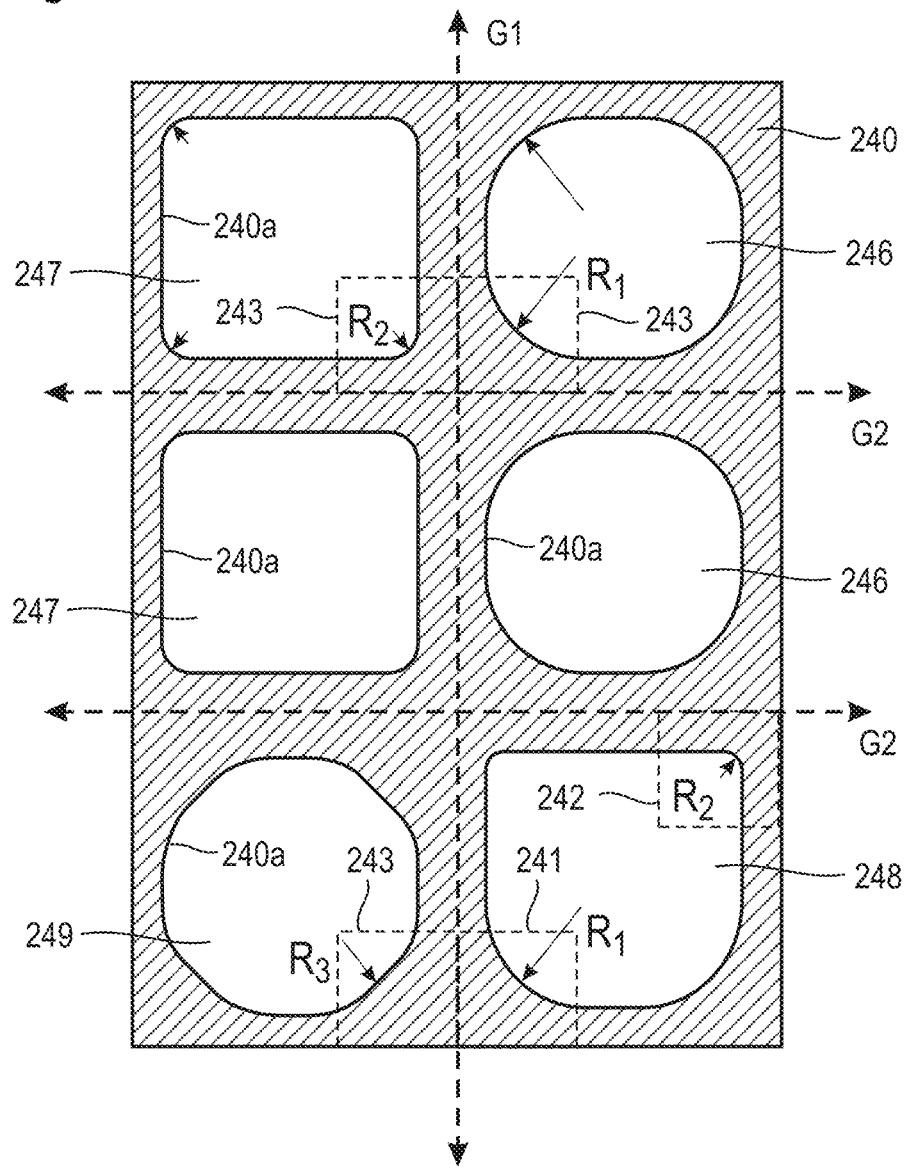
FIG. 13 illustrates different gate crossing regions according to various embodiments.

With respect to FIG. 13 further embodiments are described. FIG. 13 illustrates, in plain view onto a first side of the semiconductor substrate, the layout of intersecting gate trenches 240 generally crossing at 90° while having gate crossing regions of different shape. The gate trenches 240 corresponding to the hatched area in FIG. 13 generally run, relative to the orientation of FIG. 13, in vertical direction indicated by G1 and in lateral direction indicated by G2. From a perspective of the semiconductor substrate, the gate trenches 240 extend perpendicular to each other along the first side of the semiconductor substrate. The intersecting gate trenches 240 form a grid structure having a plurality of grid meshes 246, 247, 248 and 249. Each grid mesh 246, 247, 248 and 249 is defined and formed by a close loop boundary 240a of the gate trenches 240 which completely surrounds the respective grid meshes when seen in plan projection onto the first side.

The shape or layout of the gate crossing regions is defined by the inner boundary 240a of the gate trenches 240. Dashed squares denoted by 241 indicate for example gate crossing regions with a round transition defined by a first radius $R_1$ while dashed squares denoted by 242 indicates gate crossing regions with a sharp transition defined by a second radius $R_2$. The first radius $R_1$ is significantly larger than the second radius $R_2$ resulting in the above-described early-on effect.

Each of the grid meshes 246 has identical gate crossing regions 241 of the same first radius $R_1$. Similar, each of the grid meshes 247 has identical gate crossing regions 242 of the same second radius $R_2$. It is, however, also possible to provide a grid mesh with different gate crossing regions 241, 242 as illustrated by grid mesh 248.

In a further variation, in addition to gate crossing regions defined by first radius $R_1$ and second radius $R_2$, grid meshes having third gate crossing regions 243 defined by a third radius $R_3$ can also be provided. This is illustrated at grid mesh 249. The grid structure formed by the intersecting gate trenches 240 can therefore include at least two different kinds of grid meshes having a different shape defined by the respective inner boundary 240a of the intersecting gate trenches 240.

The spicular trenches are not illustrated in FIG. 13. A respective one of the spicular trenches can be arranged in a respective one of the grid meshes.

In view of the above, a power semiconductor device according to an embodiment includes a semiconductor substrate 100 having a first side 101, and a plurality of spaced apart spicular trenches 130 extending from the first side 101 into the semiconductor substrate 100, wherein each of the spicular trenches 130 includes a field electrode 131. A plurality of intersecting gate trenches 140 are arranged between adjacent spicular trenches 130. When seen in plan projection onto the first side 101, the plurality of the intersecting gate trenches 140 form a grid structure with a plurality of grid meshes 246, 247 248 and 249 to surround respective spicular trenches 130. The gate trenches 140 include respective gate electrodes 141 adjacent to body regions 152 and define channel regions 156 in the body regions 152. A respective channel region completely surrounds a respective spicular trench 130 when seen in plan projection onto the first side 101 of the semiconductor substrate 100. The plurality of grid meshes comprises grid meshes of different shape when seen in plan projection onto the first side 101.

Figure 14:
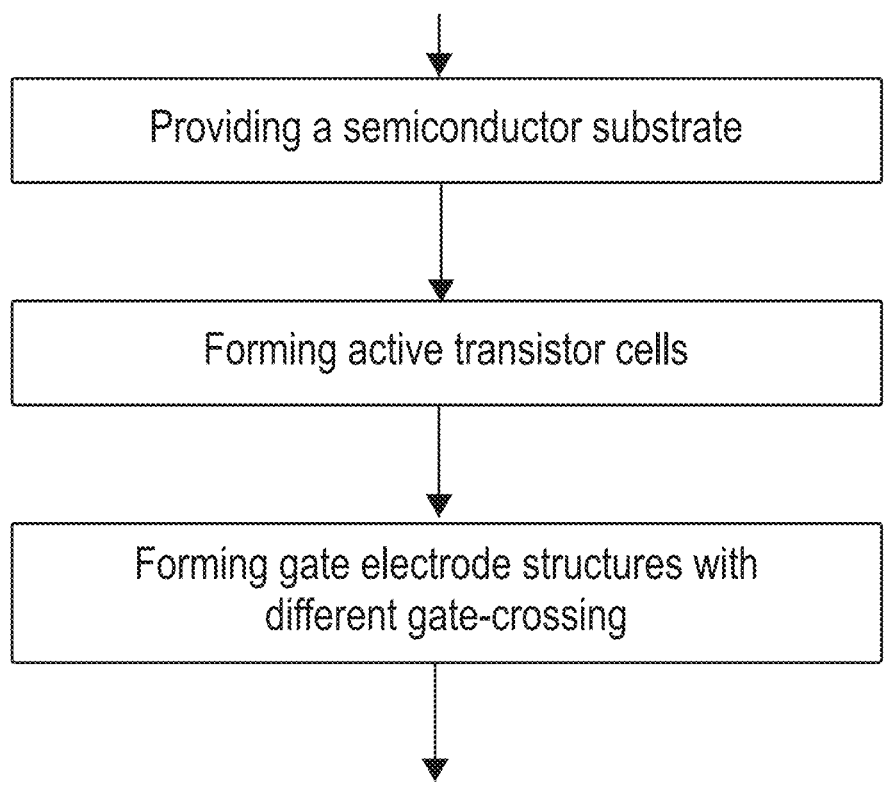
FIG. 14 illustrates processes for manufacturing a power semiconductor device according to an embodiment.

With reference to FIG. 14, a method for manufacturing a power semiconductor device is described. In a first process, a semiconductor substrate 100 having a first side 101 is provided. In following processes, a plurality of active transistor cells 171, 172 are formed in an active area 104 of the semiconductor substrate 100. According to an embodiment, at least some or each of the plurality of active transistor cells 171, 172 can optionally include a spicular trench 130 which extends from the first side 101 into the semiconductor substrate 100 and which comprises a field electrode 131. The spicular trenches 130 can, for example, be formed by etching the semiconductor substrate followed by forming a thick thermal oxide forming a field oxide 132. Conductive material can then be deposited to form a field electrode 131 inside each of the spicular trenches 130.

In a further process, a gate electrode structure is formed having a plurality of intersecting gate trenches 140, 145 running between the spicular trenches 130. The intersecting gate trenches 140, 145 form gate crossing regions of different shape when seen in plan projection onto the first side 101 of the semiconductor substrate 100 of the power semiconductor device.

The gate electrode structure can be formed by providing a mask on the first side 101 of the semiconductor substrate 100. The mask comprising spaced apart island regions of different shape to define grid meshes of different shape. An exemplary mask can for example correspond to the layout of the grid meshes 246, 247, 248, 249. The hatched area in FIG. 13 would be an area which is exposed by the mask. As exemplified by FIG. 13, the mask may comprise at least two types of different island regions which differ from each other in their outer shape to define different gate crossing regions as described above.

In a further process, the semiconductor substrate 100 is etched using the mask as etching mask to form the 160es 240.

According to an embodiment, the island regions of the etching mask comprises first island regions 246 with an outer rim having a first radius $R_1$ and second island regions 247 with an outer rim having a second radius $R_2$, wherein the first radius $R_1$ is larger than the second radius $R_2$. According to an exemplary embodiment, the first radius $R_1$ can be at least twice as large as the second radius $R_2$.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising: a semiconductor substrate having a first side;
   a plurality of active transistor cells formed in an active area of the semiconductor substrate, each of the plurality of active transistor cells comprising a spicular trench which extends from the first side into the semiconductor substrate and comprises a field electrode; and
   a gate electrode structure comprising a plurality of intersecting gate trenches running between the spicular trenches,
   wherein the plurality of intersecting gate trenches comprises a plurality of first gate crossing regions and a plurality of second gate crossing regions, each of the first gate crossing regions comprising a first wall section, each of the second gate crossing regions comprising a second wall section,
wherein the first wall section forms a transition that joins two transverse gate trench spans together,
wherein the second wall section forms a transition that joins two transverse gate trench spans together,
wherein when seen in a plan projection onto the first side of the semiconductor substrate, the first wall section has a first radius and the second wall section has a second radius that is different from the first radius.

2. The power semiconductor device of claim 1, wherein, when seen in the plan projection onto the first side, each of the first gate crossing regions defines a round transition between intersecting gate trenches with the first radius and each of the second gate crossing regions defines a sharp transition between intersecting gate trenches with the second radius, the sharp transition being relatively sharper in comparison to the round transition.

3. The power semiconductor device of claim 2, wherein the first radius is at least twice as large as the second radius.

4. The power semiconductor device of claim 2, wherein a total number of the first gate crossing regions between intersecting gate trenches is equal to or higher than a total number of the second gate crossing regions between intersecting gate trenches in the active area.

5. The power semiconductor device of claim 2, wherein a total number of the first gate crossing regions between intersecting gate trenches is between 50% and 90% of a total number of the first gate crossing regions and the second gate crossing regions in the active area.

6. The power semiconductor device of claim 2, wherein a total number of the first gate crossing regions between intersecting gate trenches is between 60% and 80% of a total number of the first gate crossing regions and the second gate crossing regions in the active area.

7. The power semiconductor device of claim 2, wherein the gate crossing regions further comprises third gate crossing regions, wherein, when seen in the plan projection onto the first side, each of third gate crossing regions defines a round transition between intersecting gate trenches with a third radius, and wherein the third radius is smaller than the first radius and larger than the second radius.

8. The power semiconductor device of claim 1, wherein the gate electrode structure comprises a gate dielectric between a gate electrode and the semiconductor substrate, and wherein the gate dielectric has substantially the same thickness in the gate crossing regions of different shape.

9. The power semiconductor device of claim 1, wherein each active transistor cell comprises a body region and a gate electrode in a respective gate trench of the gate electrode structure.

10. The power semiconductor device of claim 1, wherein the second gate crossing defines a local threshold voltage having an absolute value which is about 60% to 80% of an absolute value of a local threshold voltage of the first gate crossings.

11. A power semiconductor device, comprising: a semiconductor substrate having a first side and an active area;
   a plurality of spaced apart spicular trenches in the active area and extending from the first side into the semiconductor substrate, each of the spicular trenches comprising a field electrode; and
   a plurality of intersecting gate trenches between adjacent spicular trenches,
   wherein, when seen in a plan projection onto the first side, the plurality of the intersecting gate trenches form a grid structure with a plurality of grid meshes to surround respective spicular trenches,
   wherein the gate trenches comprise respective gate electrodes, are adjacent to body regions and define channel regions in the body regions,
   wherein a respective channel region completely surrounds a respective spicular trench when seen in the plan projection onto the first side of the semiconductor substrate,
   wherein at a first one of the grid meshes, a first wall section of the gate trenches joins transverse spans of the gate trenches together,
   wherein at a second one of the grid meshes, a second wall section of the gate trenches joins transverse spans of the gate trenches together,
   wherein the wall section has a different shape as the second wall section when seen in plan projection onto the first side, and
   wherein the plurality of grid meshes comprises first grid meshes having a substantially round boundary and second grid meshes having a partially straight boundary, wherein a percentage ratio of straight span length to curved span length in an enclosed boundary formed by the first grid meshes is greater than a percentage ratio of straight span length to curved span length formed by the second grid meshes.

12. The power semiconductor device of claim 11, wherein a total number of the first grid meshes is equal to or higher than a total number of the second grid meshes in the active area.

13. The power semiconductor device of claim 11, wherein a total number of the first grid meshes is between 50% and 90% of a total number of the first grid meshes and the second grid meshes in the active area.

14. The power semiconductor device of claim 11, wherein a total number of the first grid meshes is between 60% and 80% of a total number of the first grid meshes and the second grid meshes in the active area.

* * * * *